(12) United States Patent
Sohn et al.

(10) Patent No.: US 10,720,365 B2
(45) Date of Patent: Jul. 21, 2020

(54) METHOD OF MEASURING MISALIGNMENT OF CHIPS, A METHOD OF FABRICATING A FAN-OUT PANEL LEVEL PACKAGE USING THE SAME, AND A FAN-OUT PANEL LEVEL PACKAGE FABRICATED THEREBY

(71) Applicant: Samsung Electronics Co., Ltd., Suwon-si, Gyeonggi-do (KR)

(72) Inventors: Younghoon Sohn, Incheon (KR); Yusin Yang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/584,166

(22) Filed: May 2, 2017

(65) Prior Publication Data

US 2018/0025949 A1    Jan. 25, 2018

(30) Foreign Application Priority Data

Jul. 20, 2016 (KR) .......................... 10-2016-0092142

(51) Int. Cl.
*H01L 21/66* (2006.01)
*H01L 23/00* (2006.01)
(Continued)

(52) U.S. Cl.
CPC ............ *H01L 22/12* (2013.01); *G01B 11/272* (2013.01); *H01L 24/19* (2013.01); *H01L 24/20* (2013.01); *H01L 24/24* (2013.01); *H01L 24/82* (2013.01); *H01L 25/0655* (2013.01); *H01L 25/50* (2013.01); *G01R 31/2894* (2013.01); *G01R 31/311* (2013.01); *H01L 2224/18* (2013.01); *H01L 2224/24011* (2013.01); *H01L 2224/24101* (2013.01); *H01L 2224/24155* (2013.01); *H01L 2224/25171* (2013.01);
(Continued)

(58) Field of Classification Search
CPC ....... G01B 11/27; G01B 11/272; H01L 22/12; H01L 25/0655; G03F 7/70358
See application file for complete search history.

(56) References Cited

U.S. PATENT DOCUMENTS 4,342,090 A * 7/1982 Caccoma ................ H01L 21/67
228/180.21
4,699,515 A * 10/1987 Tanimoto .................. G03F 9/70
356/401
(Continued)

FOREIGN PATENT DOCUMENTS

JP    H10284812 A    10/1988
JP    H5152794 A     6/1993
(Continued)

*Primary Examiner* — Violeta A Prieto
(74) *Attorney, Agent, or Firm* — Harness, Dickey & Pierce, P.L.C.

(57) ABSTRACT

A method of measuring misalignment of chips, a method of fabricating a fan-out panel level package using the same, and a fan-out panel level package fabricated thereby are provided. The measuring method may include obtaining images by scanning chips on a substrate, obtaining absolute offsets of reference chips with respect to the substrate in the images, obtaining relative offsets of subordinate chips with respect to the reference chips in the images, and calculating misalignments of the chips based on the absolute offsets and the relative offsets.

20 Claims, 26 Drawing Sheets

(51) Int. Cl.
- *H01L 25/065* (2006.01)
- *H01L 25/00* (2006.01)
- *G01B 11/27* (2006.01)
- *G01R 31/28* (2006.01)
- *G01R 31/265* (2006.01)
- *G01R 31/311* (2006.01)

(52) U.S. Cl.
CPC ............ *H01L 2224/821* (2013.01); *H01L 2224/8213* (2013.01); *H01L 2224/82039* (2013.01); *H01L 2224/97* (2013.01)

(56) References Cited

U.S. PATENT DOCUMENTS

| | | | |
|---|---|---|---|
| 6,061,119 A | 5/2000 | Ota | |
| 6,876,946 B2* | 4/2005 | Yasuda | G03F 9/7003 250/548 |
| 7,030,772 B1 | 4/2006 | Lee et al. | |
| 7,248,353 B2* | 7/2007 | Kimba | G06T 7/001 356/237.4 |
| 7,759,167 B2 | 7/2010 | Vanfleteren et al. | |
| 2009/0023243 A1* | 1/2009 | Koyanagi | H01L 21/6836 438/107 |
| 2010/0210088 A1* | 8/2010 | Ishimaru | G03F 9/708 438/401 |
| 2017/0309523 A1* | 10/2017 | Sohn | H01L 21/76895 |

FOREIGN PATENT DOCUMENTS

| | | |
|---|---|---|
| JP | 2002110746 A | 4/2002 |
| JP | 4768731 B2 | 9/2011 |
| KR | 100269221 B1 | 10/2000 |
| KR | 100771306 B1 | 10/2007 |

* cited by examiner

METHOD OF MEASURING MISALIGNMENT OF CHIPS, A METHOD OF FABRICATING A FAN-OUT PANEL LEVEL PACKAGE USING THE SAME, AND A FAN-OUT PANEL LEVEL PACKAGE FABRICATED THEREBY

CROSS-REFERENCE TO RELATED APPLICATIONS

This U.S. non-provisional patent application claims priority under 35 U.S.C. § 119 to Korean Patent Application No. 10-2016-0092142, filed on Jul. 20, 2016, in the Korean Intellectual Property Office, the entire contents of which are hereby incorporated by reference.

BACKGROUND

The present disclosure relates to a semiconductor package, in particular, to a method of measuring misalignment of chips, a method of fabricating a fan-out panel level package using the same, and/or a fan-out panel level package fabricated thereby.

As an integration density of a semiconductor chip increases, its size is gradually decreased. However, a distance between bumps on a semiconductor chip may be a fixed parameter that is given by international standards of the Joint Electron Device Engineering Council (JEDEC). Accordingly, changing the number of bumps provided on a semiconductor chip may be limited. Also, as a semiconductor chip is shrunk, there are considerations in handling and testing the semiconductor chip. In addition, diversifying a board in accordance with a size of a semiconductor chip is a consideration. A fan-out panel level package has been proposed.

SUMMARY

Some example embodiments of inventive concepts provide a method of measuring misalignments of chips at a high speed.

Some example embodiments of inventive concepts provide a method capable of improving a process reliability in an exposure process which may be used to fabricate a package.

According to some example embodiments of inventive concepts, a method of measuring misalignment of chips in a substrate may include obtaining images by scanning the substrate and the chips, where the chips may be arranged in first and second directions in the substrate and include first to n-th chips arranged in the first direction or the second direction; obtaining absolute offsets of reference chips with respect to the substrate in the images, the reference chips corresponding to k-th ones of the chips in the images and k being an integer greater than or equal to 1 and less than or equal to n; obtaining relative offsets of subordinate chips with respect to the substrate in the images, the subordinate chips corresponding to the chips that are not reference chips among the chips; and calculating misalignments of the chips based on the absolute offsets and the relative offsets.

According to some example embodiments of inventive concepts, a method of fabricating a package may include forming cavities in a substrate; applying an adhesive tape to the substrate; providing chips in the cavity and on the adhesive tape, the chips being arranged in first and second directions, the chips including first to n-th chips arranged in the first direction or the second direction; forming an encapsulation layer on the substrate, the chips, and the adhesive tape; removing the adhesive tape, and measuring misalignments of the chips with respect to the substrate. The measuring the misalignments of the chips with respect to the substrate may include obtaining images by scanning the chips provided in the substrate; obtaining absolute offsets of reference chips with respect to the substrate in the images, the reference chips corresponding to k-th ones of the chips in the images and k being an integer greater than or equal to 1 and less than or equal to n; obtaining relative offsets of subordinate chips with respect to the reference chips in the images, the subordinate chips corresponding to the chips that are not reference chips among the chips; and calculating misalignments of the chips based on the absolute offsets and the relative offsets.

According to some example embodiments of inventive concepts, a package may include a substrate including a cavity; a chip in the cavity; an encapsulation layer in the cavity between the chip and the substrate; and lines on the encapsulation layer to connect the chip to the substrate. Each of the lines may include a first partial line and a second partial line. The first partial line may extend in a first direction from the substrate to a sidewall of the chip adjacent to the encapsulation layer. The second partial line may be connected to the first partial line on the encapsulation layer. The second partial line may extend in a second direction from the chip to a sidewall of the substrate adjacent to the encapsulation layer. The second direction may be different from the first direction.

According to some example embodiments of inventive concepts, a method of measuring misalignment of chips in a substrate may include obtaining an image of the chips on the substrate, obtaining absolute vertical offsets of traverse reference chips with respect to the substrate in the images, obtaining relative vertical offsets of first subordinate reference chips with respect to the traverse reference chips in the images, obtaining absolute horizontal offsets of longitudinal reference chips with respect to the substrate in the images, obtaining relative horizontal offsets of second subordinate reference chips with respect to the longitudinal reference chips in the images, and calculating misalignments of the chips based on the absolute vertical offsets, absolute horizontal offsets, relative vertical offsets, and relative horizontal offsets. The chips may be spaced apart from each other in rows and columns in the substrate. The chips may include chip alignment marks. The substrate may include substrate alignment marks corresponding to the chip alignment marks. The traverse reference chips may correspond to a selected chip from each of the rows of chips. The absolute vertical offsets may be based on vertical distance reference values and distances between the chip alignment marks of the traverse reference chips and the substrate alignment marks that are adjacent to the chip alignment marks of the traverse reference chips. The first subordinate chips may correspond to unselected chips from each of the rows of chips. The relative vertical offsets may be based on distances between the chip alignment marks of the traverse reference chips and the chip alignment marks of the first subordinate chips that are adjacent to the chip alignment marks of the traverse reference chips. The longitudinal reference chips may correspond to a selected chip from each of the columns of chips. The absolute horizontal offsets may be based on horizontal distance reference values and distances between the chip alignment marks of the longitudinal reference chips and the substrate alignment marks that are adjacent to the chip alignment marks of the longitudinal reference chips. The second subordinate chips may correspond to unselected chips from each of the columns of chips. The horizontal vertical offsets may be based on the absolute horizontal offsets and distances between the chip alignment marks of the longitudinal reference chips and the chip alignment marks of the second subordinate chips that are adjacent to the chip alignment marks of the longitudinal reference chips.

BRIEF DESCRIPTION OF THE DRAWINGS

Inventive concepts will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
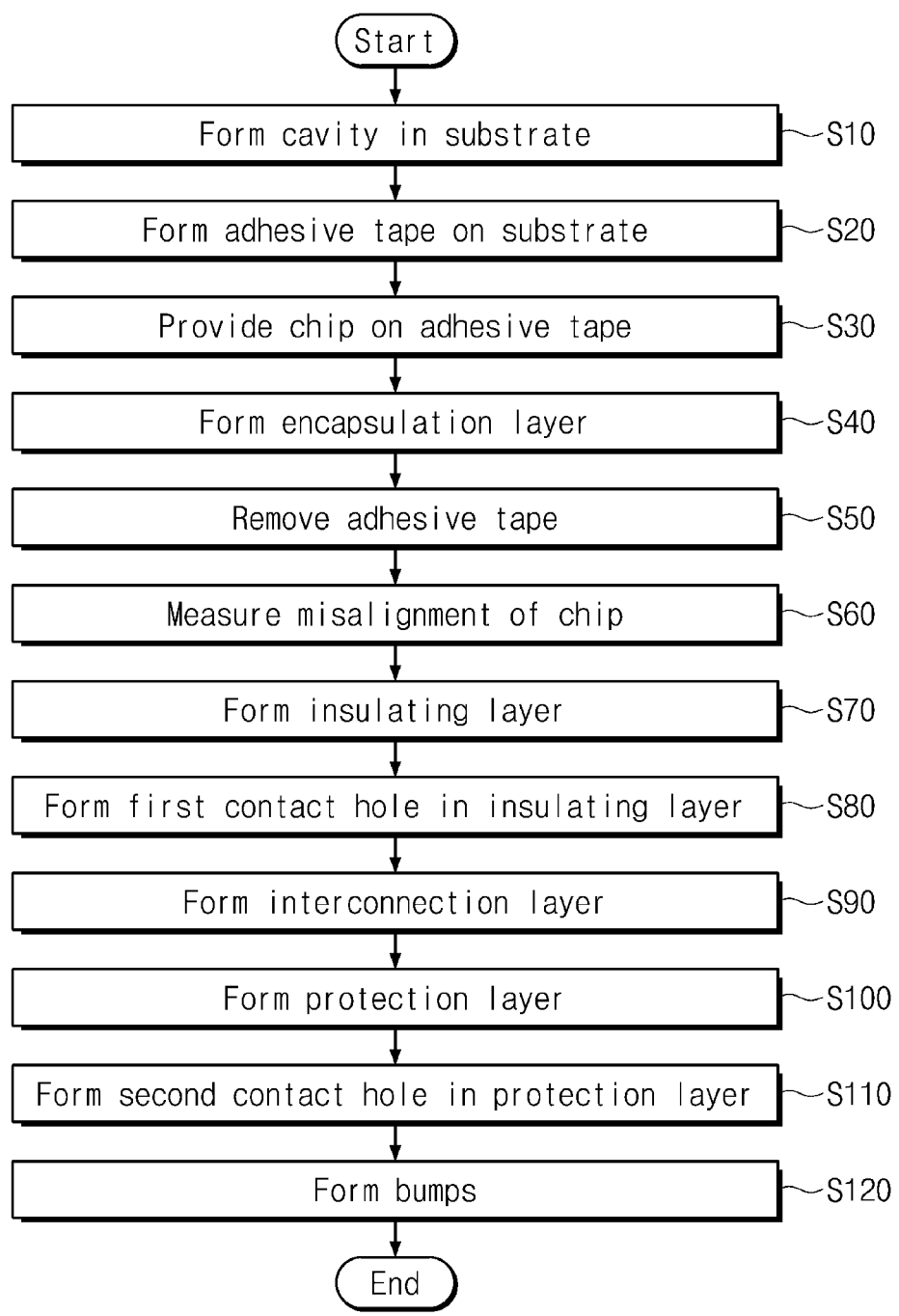
FIG. 1 is a flow chart illustrating a method of fabricating a package, according to some example embodiments of inventive concepts.

FIG. 1 is a flow chart illustrating a method of fabricating a package, according to some example embodiments of inventive concepts.

Referring to FIG. 1, a method of fabricating a package, according to some example embodiments of inventive concepts, may be used to fabricate a fan-out panel level package. In some example embodiments, the method may include forming a cavity in a substrate (in S10), forming an adhesive tape on the substrate (in S20), providing a chip on the adhesive tape (in S30), forming an encapsulation layer (in S40), removing the adhesive tape (in S50), measuring a misalignment of a chip (in S60), forming an insulating layer (in S70), forming a first contact hole in the insulating layer (in S80), forming an interconnection layer (in S90), forming a protection layer (in S100), forming a second contact hole in the protection layer (in S110), and forming bumps (in S120).

FIGS. 2 to 23 are sectional views illustrating a process of fabricating a package using the method of FIG. 1.

Figure 2:
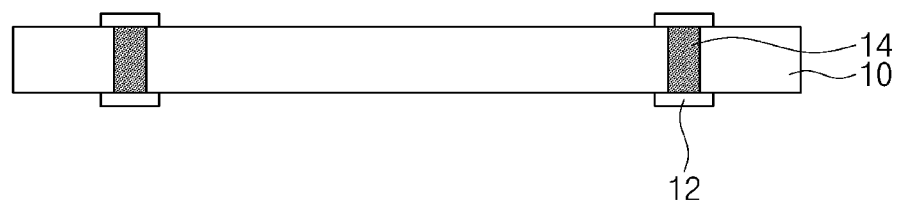
FIGS. 2 to 23 are sectional views illustrating a process of fabricating a package using the method of FIG. 1.

Referring to FIG. 2, a substrate 10 may be a fan-out printed circuit board. For example, the substrate 10 may include substrate pads 12 and substrate lines 14. The substrate pads 12 may be formed on top and bottom surfaces of the substrate 10. The substrate lines 14 may be formed in the substrate 10. For example, the substrate lines 14 may include vertical lines. The substrate lines 14 may extend through the substrate 10. In some example embodiments, the substrate lines 14 may further include horizontal lines.

Figure 3:

Referring to FIGS. 1 and 3, a cavity 16 may be formed in the substrate 10 (in S10). The cavity 16 may be formed between the substrate pads 12. Also, the cavity 16 may be formed between the substrate lines 14. The cavity 16 may penetrate the substrate 10 from a top surface to a bottom surface. For example, the cavity 16 may be a through hole that is formed to penetrate the substrate 10.

Figure 4:

Referring to FIGS. 1 and 4, an adhesive tape 18 may be formed on the substrate 10 (in S20). The adhesive tape 18 may be formed to block the cavity 16. For example, the adhesive tape 18 may include a pressure sensitive adhesive (PSA) tape.

Figure 5:
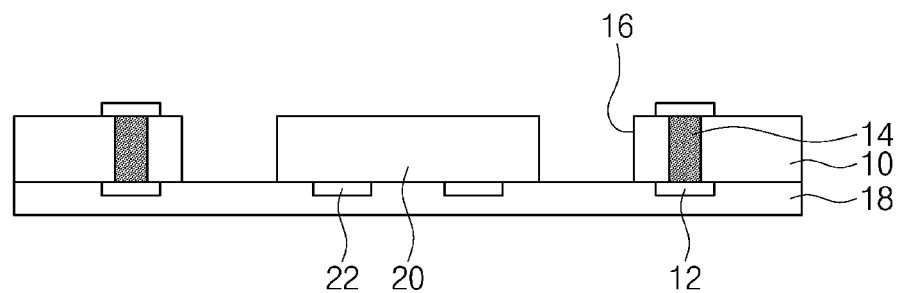

Referring to FIGS. 1 and 5, a chip 20 may be provided in the cavity 16 and on the adhesive tape 18 (in S30). The chip 20 may have an area smaller than that of the cavity 16. The chip 20 may include a semiconductor chip. For example, the chip 20 may include a memory device, a solid state drive, or an application processor. The chip 20 may include device pads 22. The chip 20 may be disposed on the adhesive tape 18 using, for example, a picker of a placer system (not shown). Thus, the chip 20 may be located at a desired position in the cavity 16. The device pads 22 may be attached to the adhesive tape 18.

Figure 6:
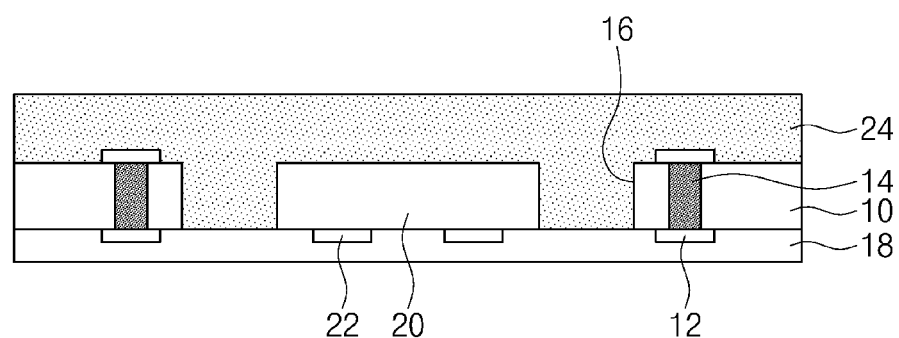

Referring to FIGS. 1 and 6, an encapsulation layer 24 may be formed on the substrate 10 and the chip 20 (in S40). For example, the encapsulation layer 24 may be dropped or coated on the substrate 10, the chip 20, and the adhesive tape 18. In the cavity 16, the encapsulation layer 24 may be formed to fill a space and/or distance between sidewalls of the chip 20 and the substrate 10. Thereafter, the encapsulation layer 24 may be hardened. For example, the encapsulation layer 24 may be formed of or include at least one of epoxy polymer, acrylic polymer, or silicone polymer.

Figure 7:
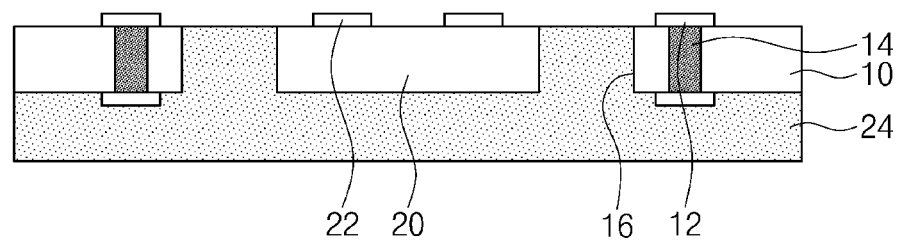
Figure 8:
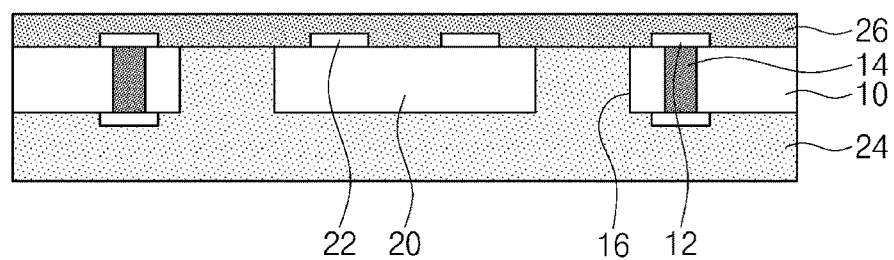

Referring to FIGS. 1 and 7, the adhesive tape 18 may be removed (in S50). For example, the adhesive tape 18 may be detached from the substrate 10, the chip 20, and the encapsulation layer 24 by an external force.

Figure 24:
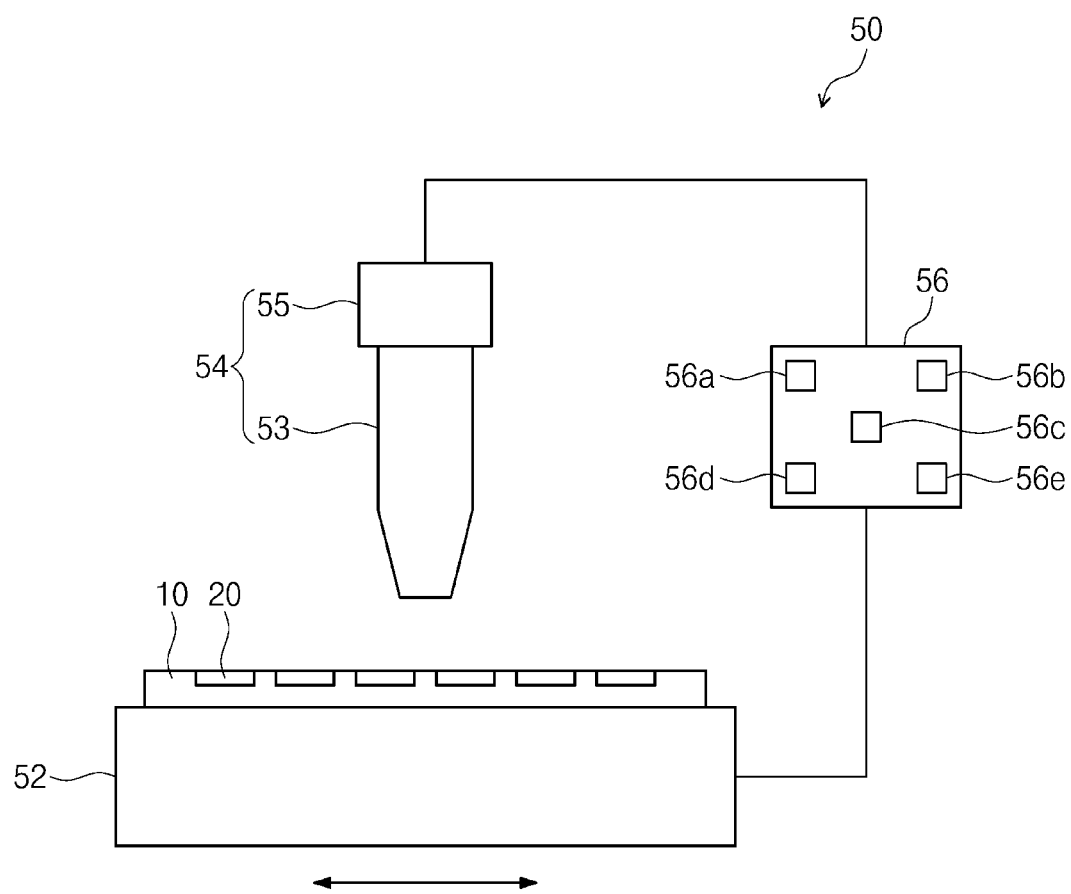
FIG. 24 is a diagram illustrating an example of a measurement system that is configured to perform a chip misalignment measurement step of FIG. 1.

FIG. 24 illustrates an example of a measurement system that is configured to perform the chip misalignment measurement step S60 of FIG. 1.

Referring to FIGS. 1, 7, and 24, the measurement system 50 may be configured to measure the misalignment of the chip 20 (in S60). In some example embodiments, the measurement system 50 may include a first stage 52, a first optical system 54, and a first control unit 56. The first control unit 56 may include a processor 56a, a memory 56b, a driving unit 56c, a power supply 56d, and an input/output interface 56e, which may be connected to each other via a bus (not shown). The processor 56a may be a hardware processor such as central processing unit (CPU), a multiprocessor, a distributed processing system, an application specific integrated circuit (ASIC), and/or another suitable hardware processing unit. The driving unit 56c may include a motor for adjusting the stage 52 and a driving circuit for operating the first optical system 54 under the control of the processor 56a. Although not illustrated, the driving unit 56c may include separate components for driving the stage 52 and the first optical system 54. The memory 56b may be a nonvolatile memory, such as a flash memory, but is not limited thereto. The power supply 56d may include a battery and/or connect to an external power supply. The input/output interface 56e may be a circuit for transmitting and receiving data and/or commands from a keypad, a keyboard, a touch screen device, a display device, an audio input/output module, and the like.

When executing instructions stored in the memory 56b, the processor 56a may be configured as a special-purpose processor 56a to control the measurement system 50 to perform the chip misalignment measurement step S60 described in FIGS. 1, 25-34, and/or 35-36.

The first stage 52 may be configured to load the substrate 10 thereon. The first stage 52 may also be configured to change a horizontal position of the substrate 10. The first optical system 54 may include a first object lens 53 and a camera 55. The first object lens 53 may be used to magnify images of the substrate 10 and the chips 20. The camera 55 may be used to detect optical information constituting the images of the substrate 10 and chips 20. The first control unit 56 may control the first stage 52 and the first optical system 54. The first control unit 56 may be configured to analyze the images and thereby to detect the misalignment of the chip 20 with respect to the substrate 10.

Figure 25:
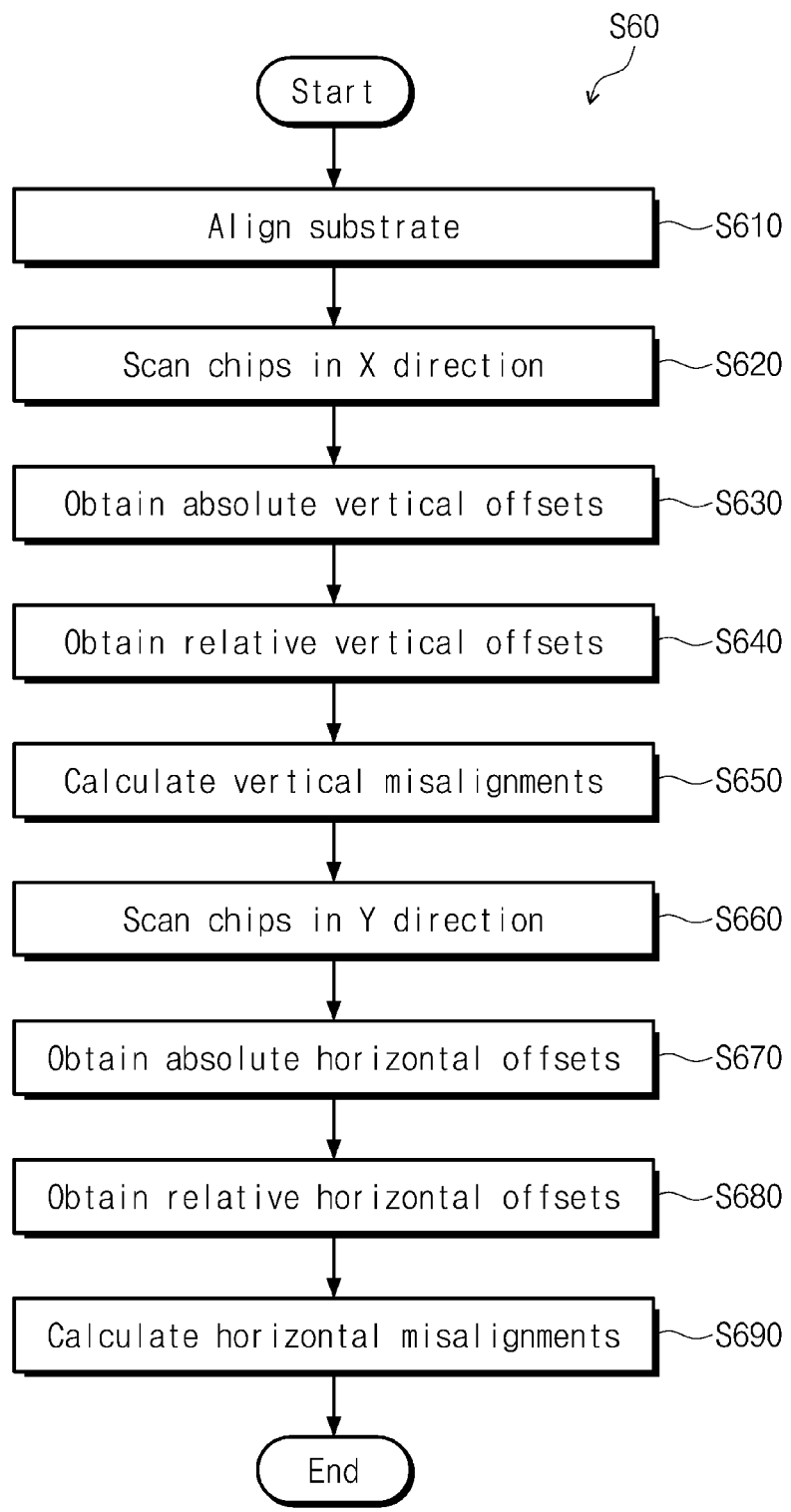
FIG. 25 is a flow chart illustrating an example of the chip misalignment measurement step of FIG. 1.

FIG. 25 is a flow chart illustrating an example of the chip misalignment measurement step S60 of FIG. 1.

Referring to FIG. 25, the chip misalignment measurement step (in S60) may include aligning the substrate 10 (in S610), scanning the chips 20 in an x direction (in S620), obtaining absolute vertical offsets (in S630), obtaining relative vertical offsets (in S640), calculating vertical misalignments of the chips 20 (in S650), scanning the substrate 10 and the chips 20 in a y direction (in S660), obtaining absolute horizontal offsets (in S670), obtaining relative horizontal offsets (in S680), and calculating horizontal misalignments of the chips 20 (in S690).

Figure 26:
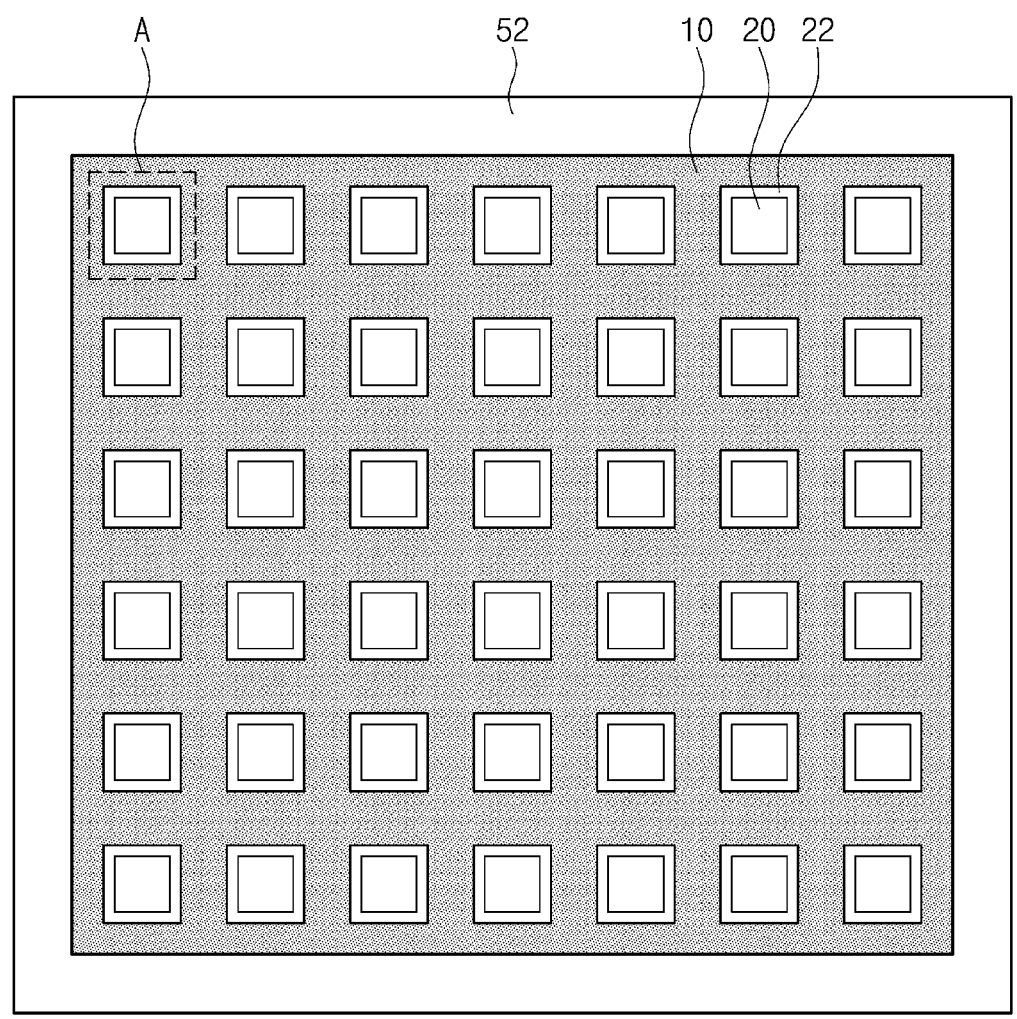
FIG. 26 is a plan view provided to describe a substrate alignment step of FIG. 25.

FIG. 26 is a plan view provided to describe an example of the substrate alignment step S610 of FIG. 25.

Referring to FIG. 26, the first control unit 56 may control alignment of the substrate 10 provided on the first stage 52 (in S610). The substrate 10 and each of the chips 20 may have a rectangular or square shape. The chips 20 may be smaller than the substrate 10. The chips 20 may be provided in the substrate 10. The number of the chips 20 provided in the substrate 10 may be about 64, but inventive concepts are not limited thereto. In some example embodiments, the chips 20 may be provided to form 8 rows and 8 columns.

Figure 27:
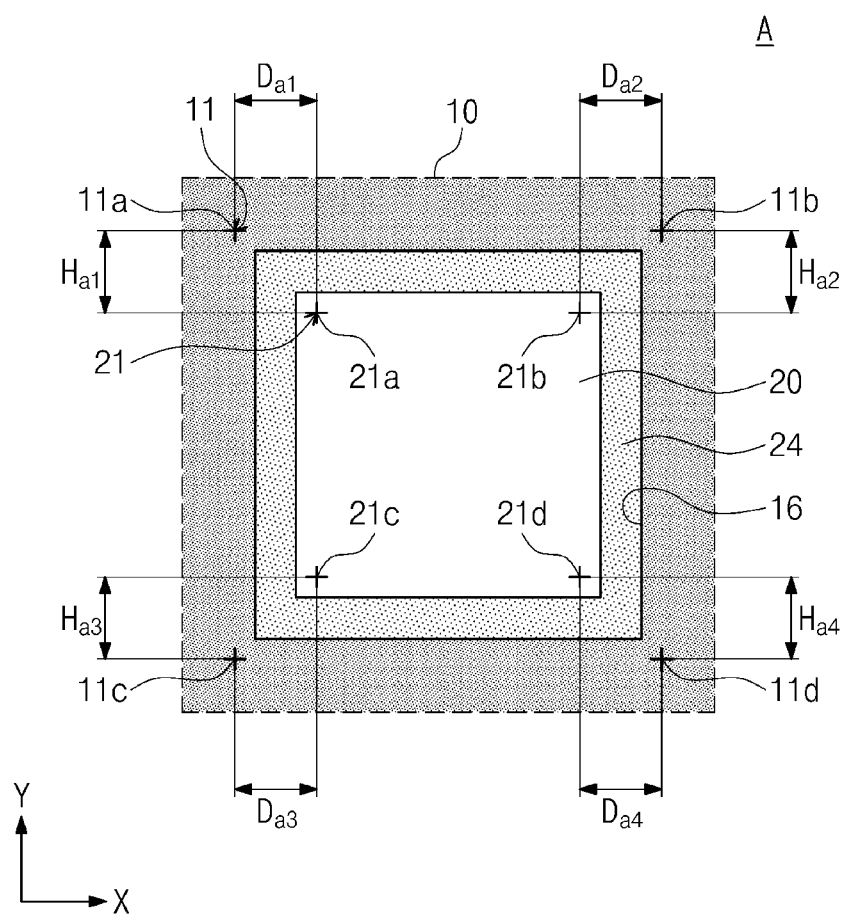
FIGS. 27 and 28 are enlarged plan views illustrating a portion 'A' of FIG. 26.
Figure 28:
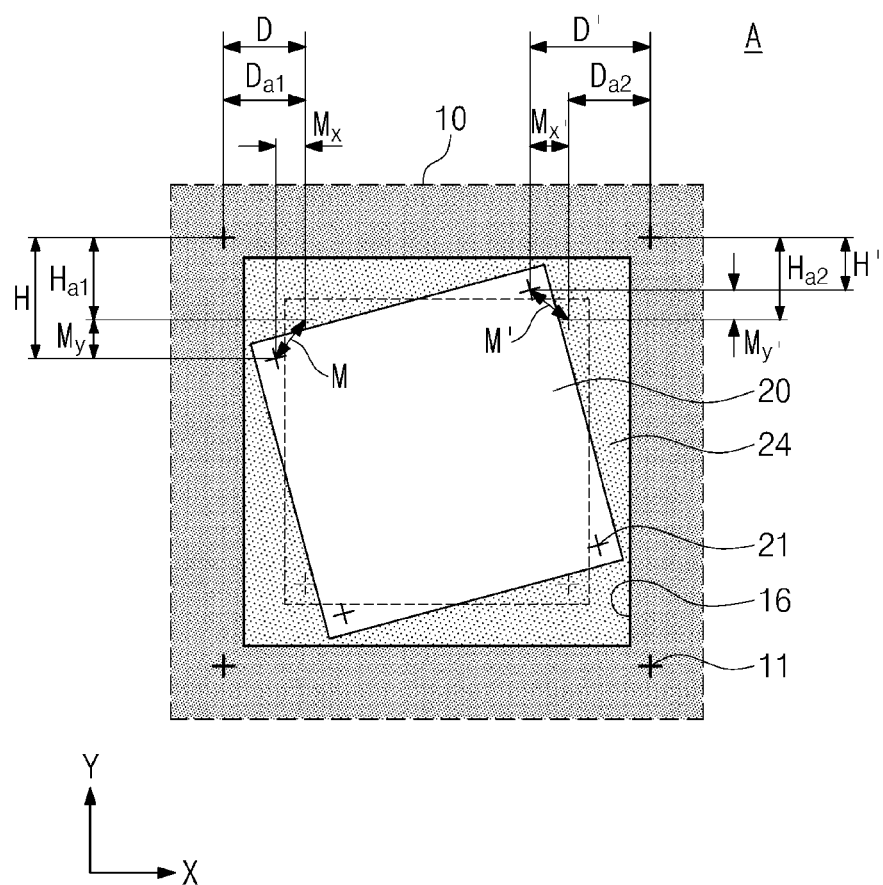

FIGS. 27 and 28 are enlarged plan views illustrating a portion 'A' of FIG. 26.

Referring to FIG. 27, the substrate 10 may include substrate alignment marks 11, and each of the chips 20 may include chip alignment marks 21.

The substrate alignment marks 11 may be formed adjacent to respective corners of the cavity 16. For example, the substrate alignment marks 11 may include a first left top alignment mark 11a, a first right top alignment mark 11b, a first left bottom alignment mark 11c, and a first right bottom alignment mark 11d. Under the control of the first control unit 56, the substrate 10 may be aligned to the first stage 52 with reference to the substrate alignment marks 11.

The chip alignment marks 21 may be formed adjacent to respective corners of each of the chips 20. For example, the chip alignment marks 21 may include a second left top alignment mark 21a, a second right top alignment mark 21b, a second left bottom alignment mark 21c, and a second right bottom alignment mark 21d.

In the case where the chips 20 are normally disposed in the cavity 16, the chip alignment marks 21 may be spaced apart from the substrate alignment marks 11 in desired (and/or alternatively predetermined) horizontal and vertical distances. For example, the second left top alignment mark 21a may be spaced apart from the first left top alignment mark 11a in first reference horizontal and vertical distances Da1 and Ha1 or less. The second right top alignment mark 21b may be spaced apart from the first right top alignment mark 11b in second reference horizontal and vertical distances Da2 and Ha2 or less. The second reference vertical distance Ha2 may be equal to the first reference vertical distance Ha1. The second left bottom alignment mark 21c may be spaced apart from the first left bottom alignment mark 11c in third reference horizontal and vertical distances Da3 and Ha3 or less. The third reference horizontal distance Da3 may be equal to the first reference horizontal distance Da1. The second right bottom alignment mark 21d may be spaced apart from the first right bottom alignment mark 11d in fourth reference horizontal and vertical distances Da4 and Ha4 or less. The fourth reference horizontal distance Da4 may be equal to the second reference horizontal distance Da2. The fourth reference vertical distance Ha4 may be equal to the third reference vertical distance Ha3.

Hereinafter, the first reference horizontal distance Da1, the first reference vertical distance Ha1, the second reference horizontal distance Da2, and the second reference vertical distance Ha2 will be described in more detail.

Referring to FIG. 28, in the case where the chip 20 is abnormally disposed in the cavity 16, the chip alignment marks 21 may be deviated from a reference position 20a. A measurement horizontal distance of the chip 20 may differ from a reference horizontal distance. Also, a measurement vertical distance may differ from a reference vertical distance.

In some example embodiments, the chip 20 may be disposed with a misalignment M. The misalignment M may be a vector. The misalignment M may include a left misalignment M and a right misalignment M' of the chip 20.

The left misalignment M may correspond to a misalignment of a left top corner of the chip 20. The left misalignment M may include a left vertical misalignment My and a left horizontal misalignment Mx. Thus, the left misalignment M may be expressed by coordinates of the left horizontal and vertical misalignments Mx and My; e.g., M(Mx, My). For example, the left vertical misalignment My may be given as a difference between a left measurement vertical distance H and the first reference vertical distance Ha1. The left horizontal misalignment Mx may be given as a difference between a left measurement horizontal distance D and the first reference horizontal distance Da1.

The right misalignment M' may correspond to a misalignment of a right top corner of the chip 20. The right misalignment M' may include a right vertical misalignment My' and a right horizontal misalignment Mx'. For example, the right misalignment M' may be expressed by coordinates of the right horizontal and vertical misalignments Mx' and My'; e.g., M'(Mx', My'). The right vertical misalignment My' may be given as a difference between a right measurement vertical distance H' and the second reference vertical distance Ha2. The right horizontal misalignment Mx' may be given as a difference between a right measurement horizontal distance D' and the second reference horizontal distance Da2.

Figure 29:
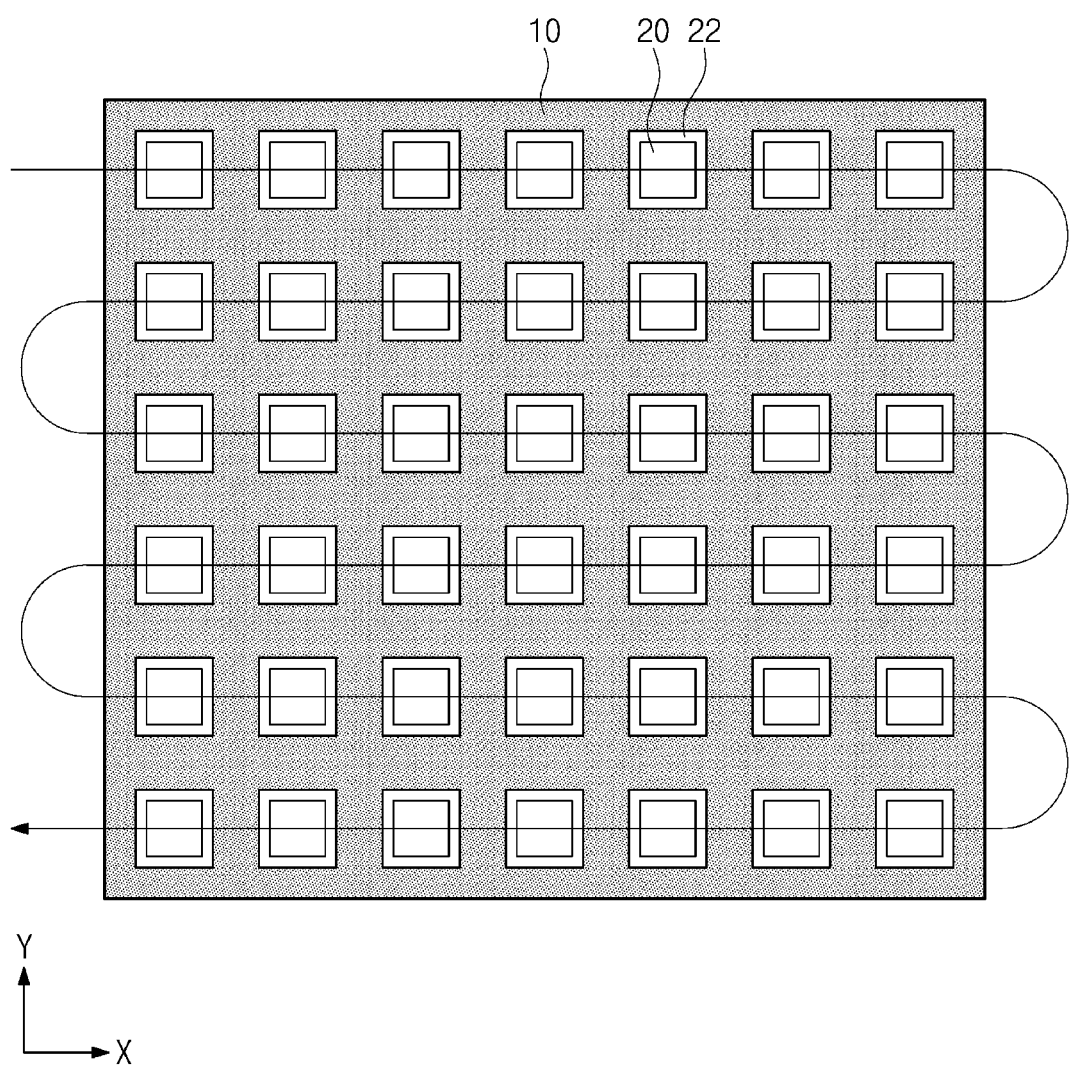
FIG. 29 is a plan view illustrating an example of an x-directional chip scanning step of FIG. 25.

FIG. 29 is a plan view illustrating an example of an x-directional chip scanning step S620 of FIG. 25.

Referring to FIG. 29, the first stage 52 and the first optical system 54 may perform a step of scanning on the substrate 10 and the chips 20 in an x direction (in S620). For example, the first stage 52 may move the substrate 10 and the chips 20 with respect to the first optical system 54 in the x direction. The x direction may be a scan direction.

Figure 30:
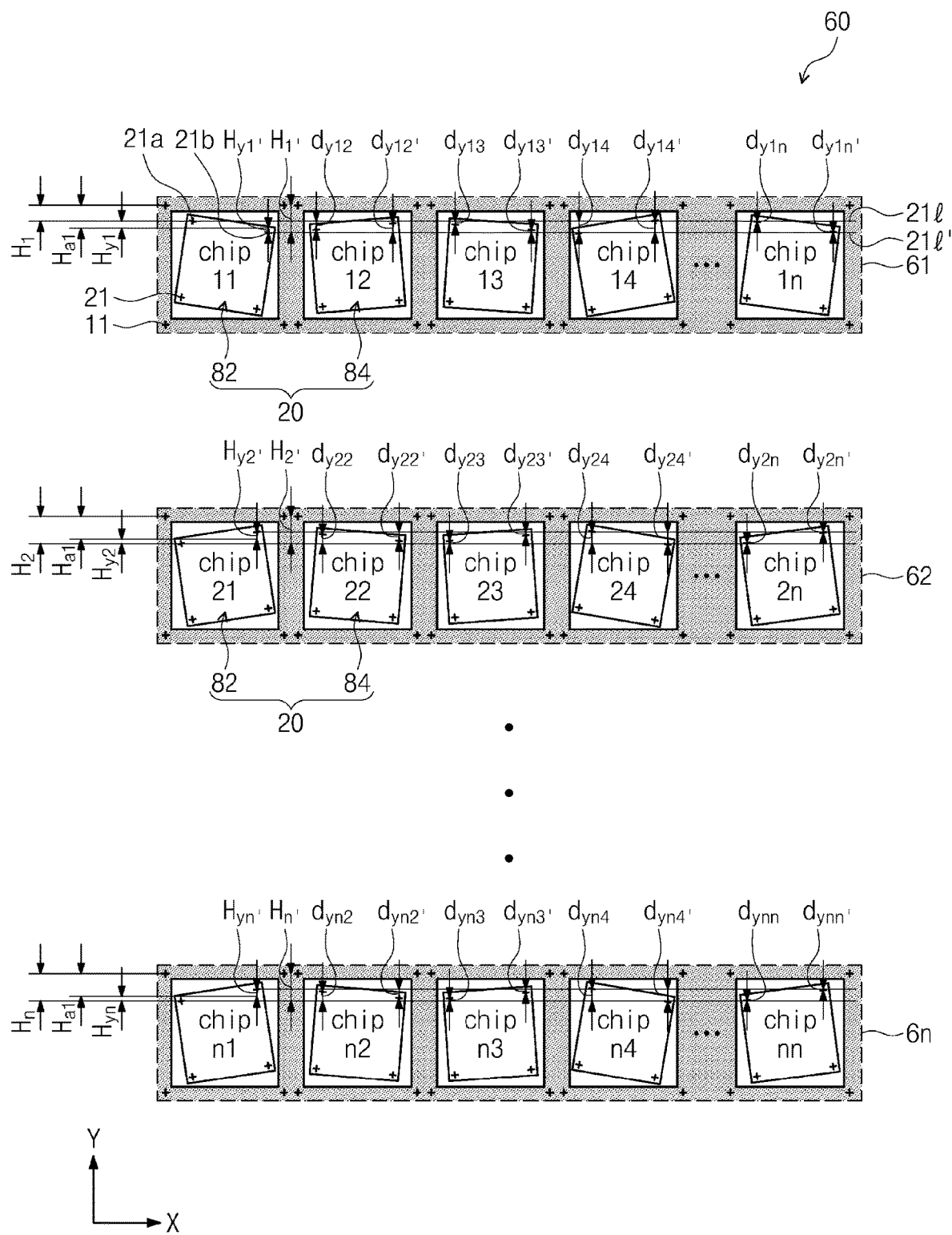
FIG. 30 is a diagram illustrating traverse images obtained by the x-directional chip scanning step of FIG. 25.

FIG. 30 is a diagram illustrating traverse images 60 obtained by the x-directional chip scanning step S620 of FIG. 25.

Referring to FIG. 30, the first control unit 56 of FIG. 24 may be used to obtain traverse images 60. In some example embodiments, the traverse images 60 may include first to n-th traverse images 61-6n. The first control unit 56 may be used to obtain, for example, first to eighth traverse images 61-68.

Figure 31:
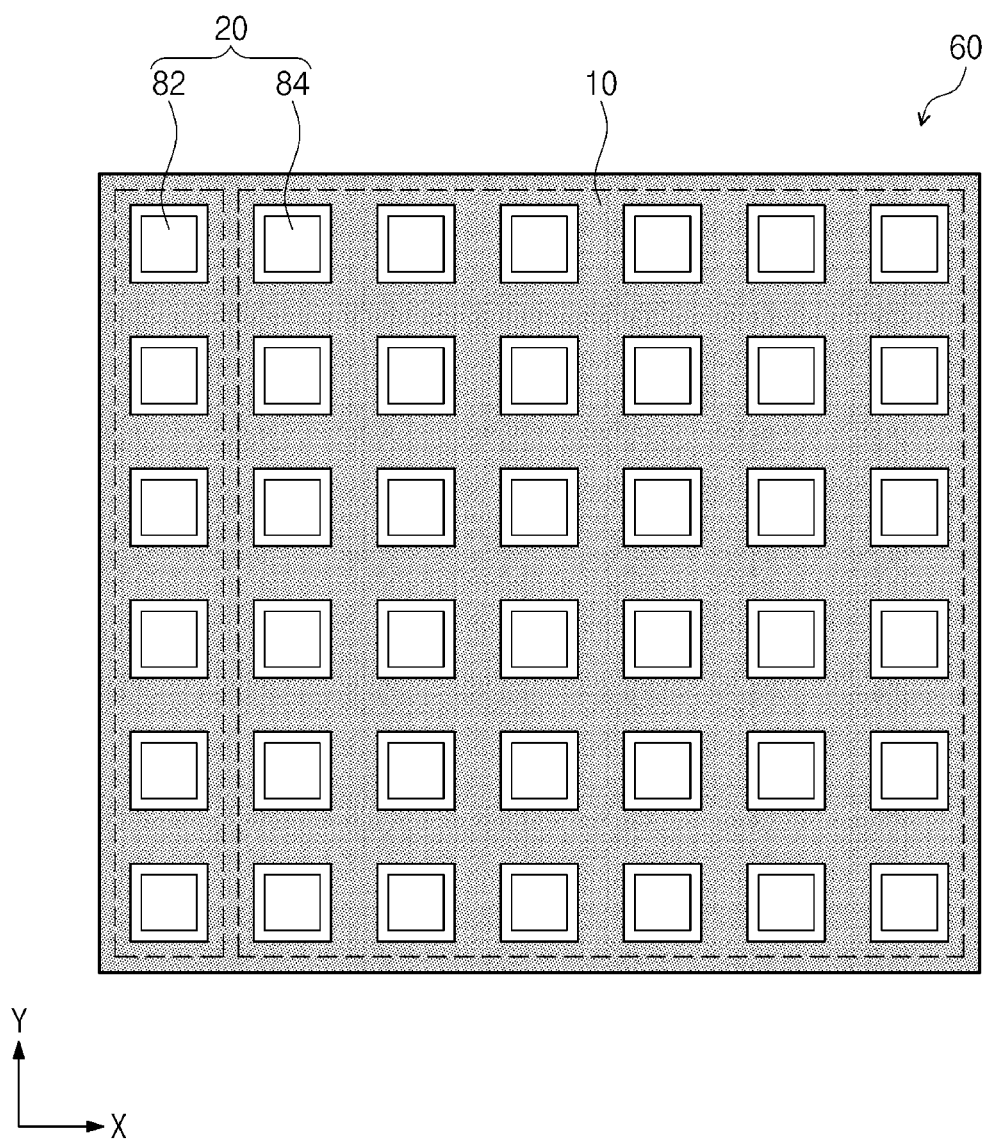
FIG. 31 is a plan view illustrating chips contained in the traverse images of FIG. 30.

FIG. 31 is a plan view illustrating chips 20 contained in the traverse images 60 of FIG. 30.

Referring to FIGS. 30 and 31, the chips 20 in the traverse images 60 may include traverse reference chips 82 and traverse subordinate chips 84. The traverse reference chips 82 may include the chips 20 constituting the first column in the traverse images 60. The traverse subordinate chips 84 may include the chips 20 constituting the second to n-th columns. Each of the traverse images 60 may have a single traverse reference chip 82 and a plurality of the traverse subordinate chips 84. For example, the number of the traverse reference chips 82 is 8, and the number of the traverse subordinate chips 84 is 56.

Referring to FIGS. 25 and 30, the first control unit 56 may obtain absolute vertical offsets of the traverse reference chips 82 in the traverse image 60 (in S630).

In some example embodiments, the absolute vertical offsets may correspond to vertical misalignments of the traverse reference chips 82. The absolute vertical offsets may include left vertical offsets Hy1-Hyn and right vertical offsets Hy1'-Hyn'. Each of the left vertical offsets Hy1-Hyn may be represented as the left vertical misalignment My (e.g., of FIG. 28) of each of the traverse reference chips 82. Each of the right vertical offsets Hy1'-Hyn' may be represented as the right vertical misalignment My' (e.g., of FIG. 28) of each of the traverse reference chips 82.

In some example embodiments, the left absolute vertical offsets Hy1-Hyn may be given as differences between left measurement vertical distances H1-Hn and the first reference vertical distance Ha1. For example, the first traverse reference chip 82 in the first traverse image 61 may have a first left absolute vertical offset Hy1 and a first right absolute vertical offset Hy1'. The first left absolute vertical offset Hy1 may be given as a difference between the first left measurement vertical distance H1 and the first reference vertical distance Ha1. The first reference vertical distance Ha1 may range from about 1 mm to about 0.001 mm. The first right absolute vertical offset Hy1' may be given as a difference between the first right measurement vertical distance H1' and the second reference vertical distance Ha2.

The traverse reference chip 82 in the second traverse image 62 may have a second left absolute vertical offset Hy2 and a second right absolute vertical offset Hy2'. The second left absolute vertical offset Hy2 may be given as a difference between the second left measurement vertical distance H2 and the first reference vertical distance Ha1. The second right absolute vertical offset Hy2' may be given as a difference between the second right measurement vertical distance H2' and the second reference vertical distance Ha2.

Furthermore, the traverse reference chip 82 in the n-th traverse image 6n may have an n-th left absolute vertical offset Hn and an n-th right absolute vertical offset Hn'. The n-th left absolute vertical offset Hn may be given as a difference between n-th left measurement vertical distance Hn and the first reference vertical distance Ha1. The n-th right absolute vertical offset Hn' may be given as a difference between the n-th right measurement vertical distance Hn' and the second reference vertical distance Ha2.

Next, the first control unit 56 may obtain relative vertical offsets of the traverse subordinate chips 84 with respect to the traverse reference chips 82 (in S640). The relative vertical offsets may be y-directional offsets between the chip alignment marks 21 of the traverse reference chips 82 and the chip alignment marks 21 of the traverse subordinate chips 84. The relative vertical offsets may include left relative vertical offsets dy12-dynn and right relative vertical offsets dy12'-dynn'.

The left absolute vertical offsets Hy1-Hyn of the traverse reference chips 82 may be used as references for measuring the left relative vertical offsets dy12-dynn of the traverse subordinate chips 84. The right absolute vertical offsets Hy1'-Hyn' may be used as references for measuring the right relative vertical offsets dy12'-dynn'. An x-directional extension line 21l of the second left top alignment marks 21a of the traverse reference chips 82 may be reference lines for the second left top alignment marks 21a of the traverse subordinate chips 84. An x directional extension line 21l' of the second right top alignment marks 21b of the traverse reference chips 82 may be reference lines for the second right top alignment marks 21b of the traverse subordinate chips 84.

For example, the traverse subordinate chips 84 in the first traverse image 61 may have a first left relative vertical offset dy12 to a (n−1)-th left relative vertical offset dy1n. In addition, the traverse subordinate chips 84 in the first traverse image 61 may have a first right relative vertical offset dy12' to a (n−1)-th right relative vertical offset dy1n'. The traverse subordinate chips 84 in the n-th traverse image 6n may have a first left vertical offset dyn2 to a (n−1)-th left relative vertical offset dynn. The traverse subordinate chips 84 in the n-th traverse image 6n may have a first right relative vertical offset dyn2' to a (n−1)-th right relative vertical offset dynn'.

Next, the first control unit 56 may obtain vertical misalignments of the chips 20 (in S650). In some example embodiments, the vertical misalignments may include left vertical misalignments My and right vertical misalignments My'. For example, the vertical misalignments My of the traverse subordinate chips 84 may be calculated by a sum of the left and right absolute vertical offsets Hy1-Hyn and Hy1'-Hyn' and the left and right relative vertical offsets dy12-dynn and dy12'-dynn'. For example, the left vertical misalignment My of the first traverse subordinate chip 84 in the first traverse image 61 may be calculated by a sum of the first left absolute vertical offset Hy1 and the first left relative vertical offset dy12. The right vertical misalignment My' of the first traverse subordinate chip 84 in the first traverse image 61 may be calculated by a sum of the first right absolute vertical offset Hy1' and the first right relative vertical offset dy12. The left vertical misalignment My of the n-th traverse subordinate chip 84 in the n-th traverse image 6n may be calculated by a sum of the n-th right absolute vertical offset Hyn and the n-th left relative vertical offset dynn. The right vertical misalignment My' of the n-th traverse subordinate chip 84 in the n-th traverse image 6n may be calculated by a sum of the n-th right absolute vertical offset Hyn' and the n-th right relative vertical offset dynn'. The calculated vertical misalignments My may be provided to a placer or an exposure system (e.g., 100 of FIG. 37).

In the case where the left and right absolute vertical offsets Hy1-Hyn and Hy1'-Hyn' are zero, the left vertical misalignments My of the traverse subordinate chips 84 may correspond to the first left relative vertical offsets dy12-dyn2 to the (n−1)-th left relative vertical offsets dy1n-dynn, respectively. The right vertical misalignments My' of the traverse subordinate chips 84 may correspond to the first right relative vertical offsets dy12'-dyn2' to the (n−1)-th right relative vertical offsets dy1n'-dynn', respectively. The use of the relative vertical offsets may make it possible to easily obtain the vertical misalignments of the traverse subordinate chips 84. Furthermore, the vertical misalignments may be calculated faster, compared to a method of separately measuring a height error between the substrate alignment mark 11 and the chip alignment mark 21.

Figure 32:
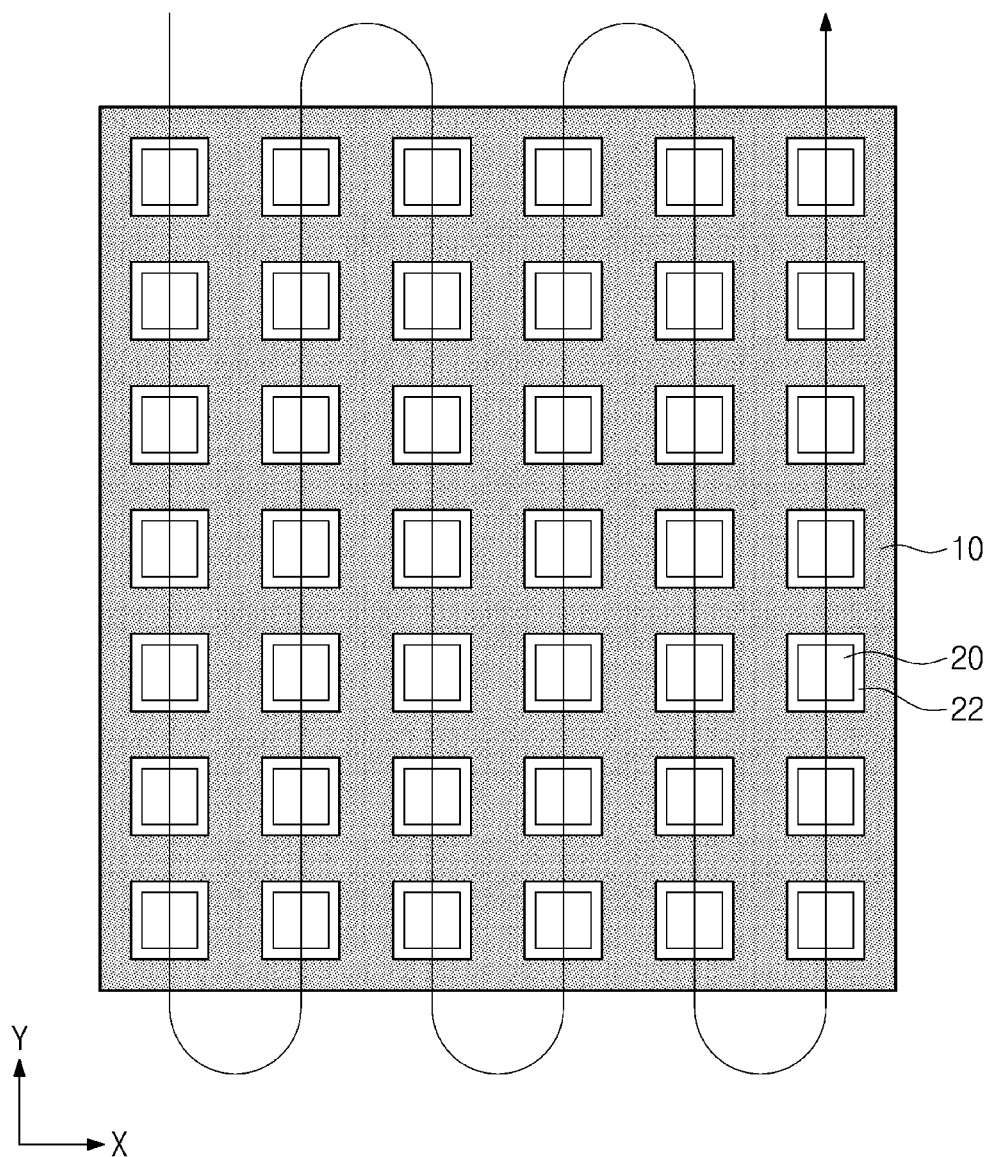
FIG. 32 is a plan view illustrating an example of a y-directional chip scanning step of FIG. 25.

FIG. 32 is a plan view illustrating an example of a y-directional chip scanning step S660 of FIG. 25.

Referring to FIGS. 25 and 32, the first stage 52 and the first optical system 54 may be used to perform a y-directional chip scanning step S660, in which the chips 20 are scanned in the y direction. For example, the first stage 52 may be configured to move the substrate 10 and the chips 20 in the y direction with respect to the first optical system 54. The y direction may be a scan direction in the y-directional chip scanning step S660.

Figure 33:
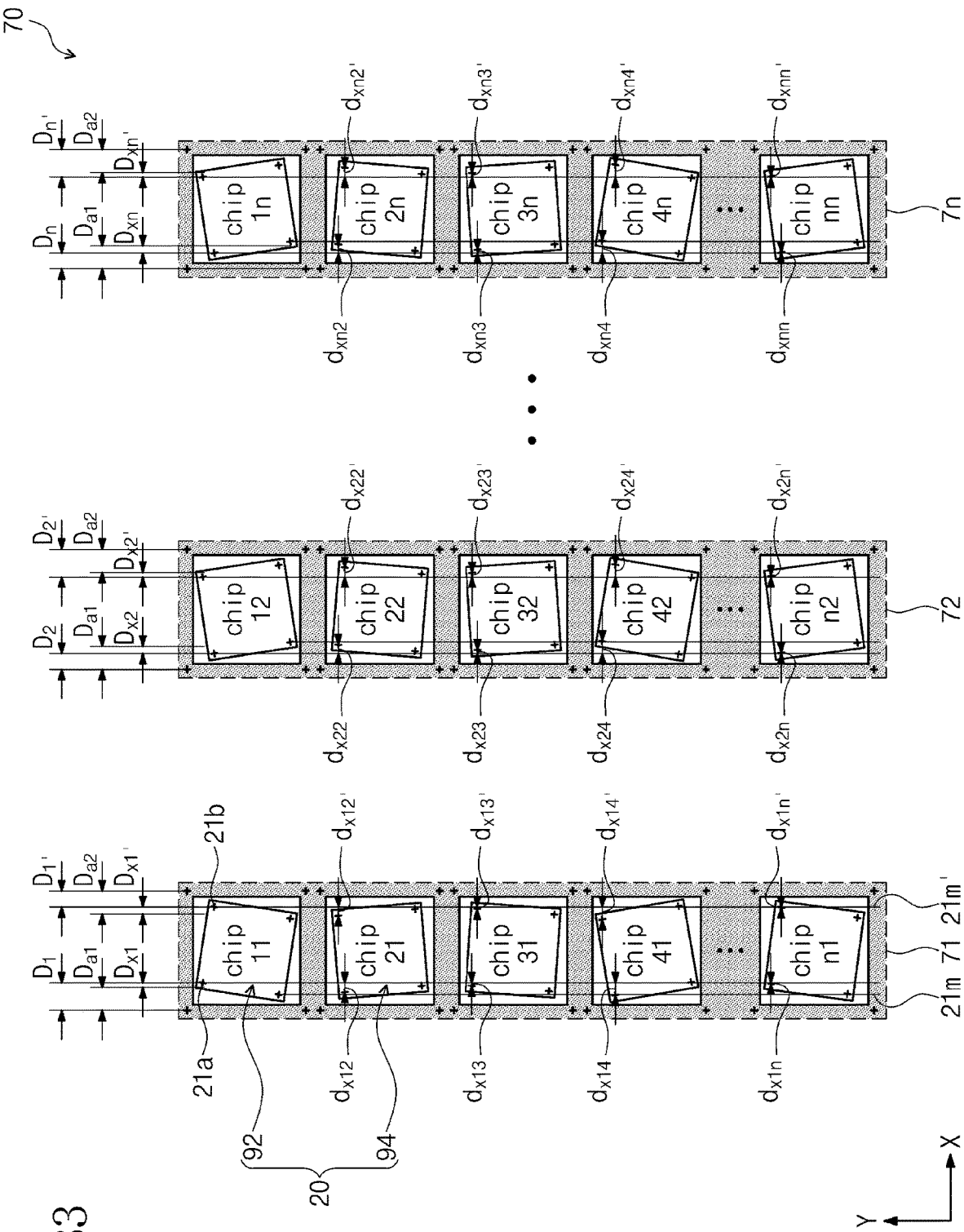
FIG. 33 is a diagram illustrating longitudinal images obtained by the y-directional chip scanning step of FIG. 32.

FIG. 33 is a diagram illustrating longitudinal images 70 obtained by the y-directional chip scanning step S660 of FIG. 32.

Referring to FIG. 33, the first control unit 56 of FIG. 24 may be used to obtain longitudinal images 70. The longitudinal images 70 may include first to n-th longitudinal images 71-7n. For example, the first control unit 56 may obtain first to eighth longitudinal images 71-78.

Figure 34:
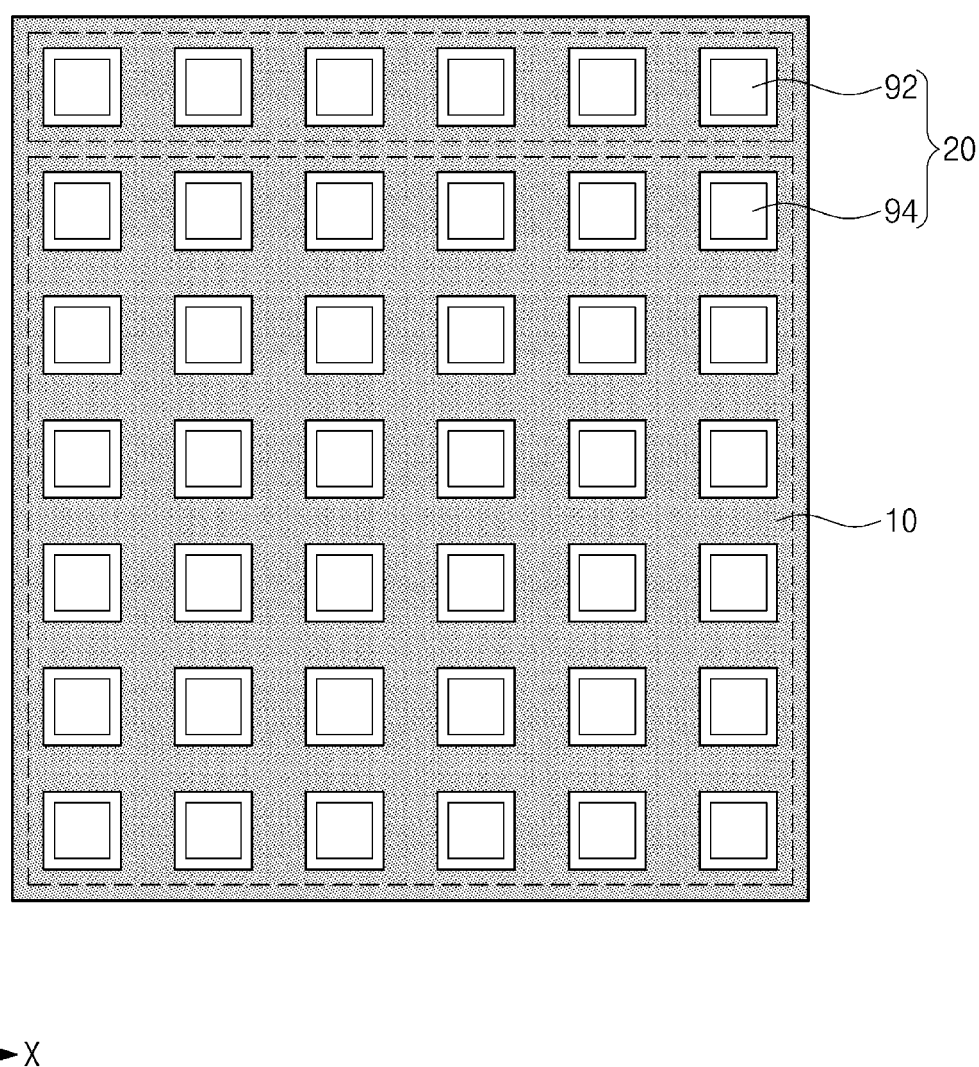
FIG. 34 is a plan view illustrating chips contained in the longitudinal images of FIG. 33.

FIG. 34 is a plan view illustrating chips 20 contained in the longitudinal images 70 of FIG. 33.

Referring to FIG. 34, the chips 20 in the longitudinal images 70 may include longitudinal reference chips 92 and longitudinal subordinate chips 94. The longitudinal reference chips 92 may include the chips 20 constituting the first row in the longitudinal images 70. The longitudinal subordinate chips 94 may be the chips 20 constituting the second to n-th rows. Each of the longitudinal images 70 may have a single longitudinal reference chip 92 and a plurality of longitudinal subordinate chips 94. For example, the number of the longitudinal reference chips 92 is 8, and the number of the longitudinal subordinate chips 94 is 56.

Referring to FIGS. 30 and 33, the traverse reference chips 82 may be the longitudinal reference chip 92 and the longitudinal subordinate chips 94 in the first longitudinal image 71. The traverse subordinate chips 84 in the second to n-th traverse images 62-6n may be the longitudinal subordinate chips 94 in the second to n-th longitudinal images 72-7n. Also, the longitudinal reference chips 92 may be the traverse reference chip 82 and the traverse subordinate chips 84 in the first traverse image 61.

Referring to FIGS. 25 and 33, the first control unit 56 may be used to obtain absolute horizontal offsets of the longitudinal reference chips 92 in the longitudinal images 70 (in S670).

In some example embodiments, each of the absolute horizontal offsets may be horizontal misalignments of the longitudinal reference chips 92. The absolute horizontal offsets may include left absolute horizontal offsets Dx1-Dxn and right absolute horizontal offsets Dx1'-Dxn'. Each of the left absolute horizontal offsets Dx1-Dxn may be represented as the left horizontal misalignment Mx (of FIG. 28) of each of the longitudinal reference chips 92. Each of the right absolute horizontal offsets Dx1'-Dxn' may be represented as the right horizontal misalignment Mx' (e.g., of FIG. 28) of each of the longitudinal reference chips 92.

In some example embodiments, the left absolute horizontal offsets Dx1-Dxn may be given as a difference between left measurement horizontal distances D1-Dn and the first reference horizontal distance Da1. The first reference horizontal distance Da1 may range from about 1 mm to about 0.001 mm. For example, the first longitudinal reference chip 72 in the first longitudinal image 71 may have a first left absolute horizontal offset Dx1 and a first right absolute horizontal offset Dx1'. For example, the first left absolute horizontal offset Dx1 may be given as a difference between the first left measurement horizontal distance D1 and the first reference horizontal distance Da1. The first right absolute horizontal offset Dx1' may be given as a difference between a first right measurement horizontal distance D1' and the second reference horizontal distance Da2'.

The longitudinal reference chip 92 in the n-th longitudinal image 7n may have an n-th left absolute horizontal offset Dxn and an n-th right absolute horizontal offset Dxn'. The n-th left absolute horizontal offset Dxn may be given as a difference between the n-th left measurement horizontal distance Dn and the first reference horizontal distance Da1. The n-th right absolute horizontal offset Dxn' may be given as a difference between the n-th right measurement horizontal distance Dn' and the second reference horizontal distance Da2.

Thereafter, the first control unit 56 may obtain relative horizontal offsets of the longitudinal subordinate chips 94 with respect to the longitudinal reference chips 92 (in S680). The relative horizontal offsets may be x directional offsets between the longitudinal reference chips 92 and the longitudinal subordinate chips 94. In some example embodiments, the relative horizontal offsets may include left relative horizontal offsets dx12-dxnn and right relative horizontal offsets dx12'-dxnn'.

The left absolute horizontal offsets Dx1-Dxn of the longitudinal reference chips 92 may be used as reference absolute vertical offsets for the left relative horizontal offsets dx12-dxnn of the longitudinal subordinate chips 94. The right absolute horizontal offsets Dx1'-Dxn' of the longitudinal reference chips 92 may be used as reference values for measuring the right relative horizontal offsets dx12'-dxnn' of the longitudinal subordinate chips 94. Y-directional extension lines 21m of the second left top alignment marks 21a of the longitudinal reference chips 92 may be reference lines for the second left top alignment marks 21a of the longitudinal subordinate chips 94. Y-directional right extension lines 21m' of the second right top alignment marks 21b of the longitudinal reference chips 92 may be reference lines for the second right top alignment marks 21b of the longitudinal subordinate chips 94.

For example, the longitudinal subordinate chips 94 in the first longitudinal image 71 may have a first left relative horizontal offset dx12 to a (n−1)-th left relative horizontal offset dx1n. The longitudinal subordinate chips 94 in the first longitudinal image 71 may have a first right relative horizontal offset dx12' to a (n−1)-th right relative horizontal offset dx1n'. The longitudinal subordinate chips 94 in the n-th longitudinal image 9n may have a first left relative horizontal offset dxn2 to a (n−1)-th left relative vertical offset dxnn. The longitudinal subordinate chips 94 in the n-th longitudinal image 9n may have a first right relative horizontal offset dxn2' to a (n−1)-th right relative vertical offset dxnn'.

Next, the first control unit 56 may calculate horizontal misalignments of the chips 20 (in S690). In some example embodiments, the horizontal misalignments may include left horizontal misalignments Mx and horizontal misalignments Mx. For example, the left horizontal misalignments Mx of the longitudinal subordinate chips 94 may be calculated by a sum of the left absolute horizontal offsets Dx1-Dxn and the left relative horizontal offsets dx12-dx1n. Also, the right horizontal misalignments Mx' may be calculated by a sum of the right absolute horizontal offsets Dx1'-Dxn' and the right relative horizontal offsets dx12'-dx1n'. For example, the left vertical misalignment My of the first longitudinal subordinate chip 94 in the first longitudinal image 71 may be calculated by a sum of the first left absolute horizontal offset Dx1 and the first left relative horizontal offset dx12. The right vertical misalignment My' of the first longitudinal subordinate chip 94 in the first longitudinal image 71 may be calculated by a sum of the first right absolute horizontal offset Dx1' and the first right relative horizontal offset dx12'. The left vertical misalignment My of the n-th subordinate chip 94 in the n-th longitudinal image 7n may be calculated by a sum of the n-th left absolute horizontal offset Dxn and the n-th left relative horizontal offset dxnn. The right vertical misalignment My' of the n-th subordinate chip 94 in the n-th longitudinal image 7n may be calculated by a sum of the n-th right absolute horizontal offset Dxn' and the n-th right relative horizontal offset dxnn'. The calculated horizontal misalignments may be provided to a placer or an exposure system (e.g., 100 of FIG. 35).

For example, in the case where the left and right absolute horizontal offsets Dx1-Dxn and Dx1'-Dxn' are zero, the left horizontal misalignments Mx of the longitudinal subordinate chips 94 may correspond to the first left relative horizontal offsets dx12-dxn2 to the (n−1)-th left relative horizontal offsets dx1n-dxnn, respectively. Also, the right horizontal misalignments Mx' of the longitudinal subordinate chips 94 may correspond to the first right relative horizontal offsets dx12'-dxn2' to the (n−1)-th right relative horizontal offsets dx1n-dxnn', respectively. The use of the relative horizontal offsets may make it possible to easily obtain the horizontal misalignments of the longitudinal subordinate chips 94. The horizontal misalignments may be calculated faster, compared to a method of separately measuring a distance error between the substrate alignment mark 11 and the chip alignment mark 21.

Figure 35:
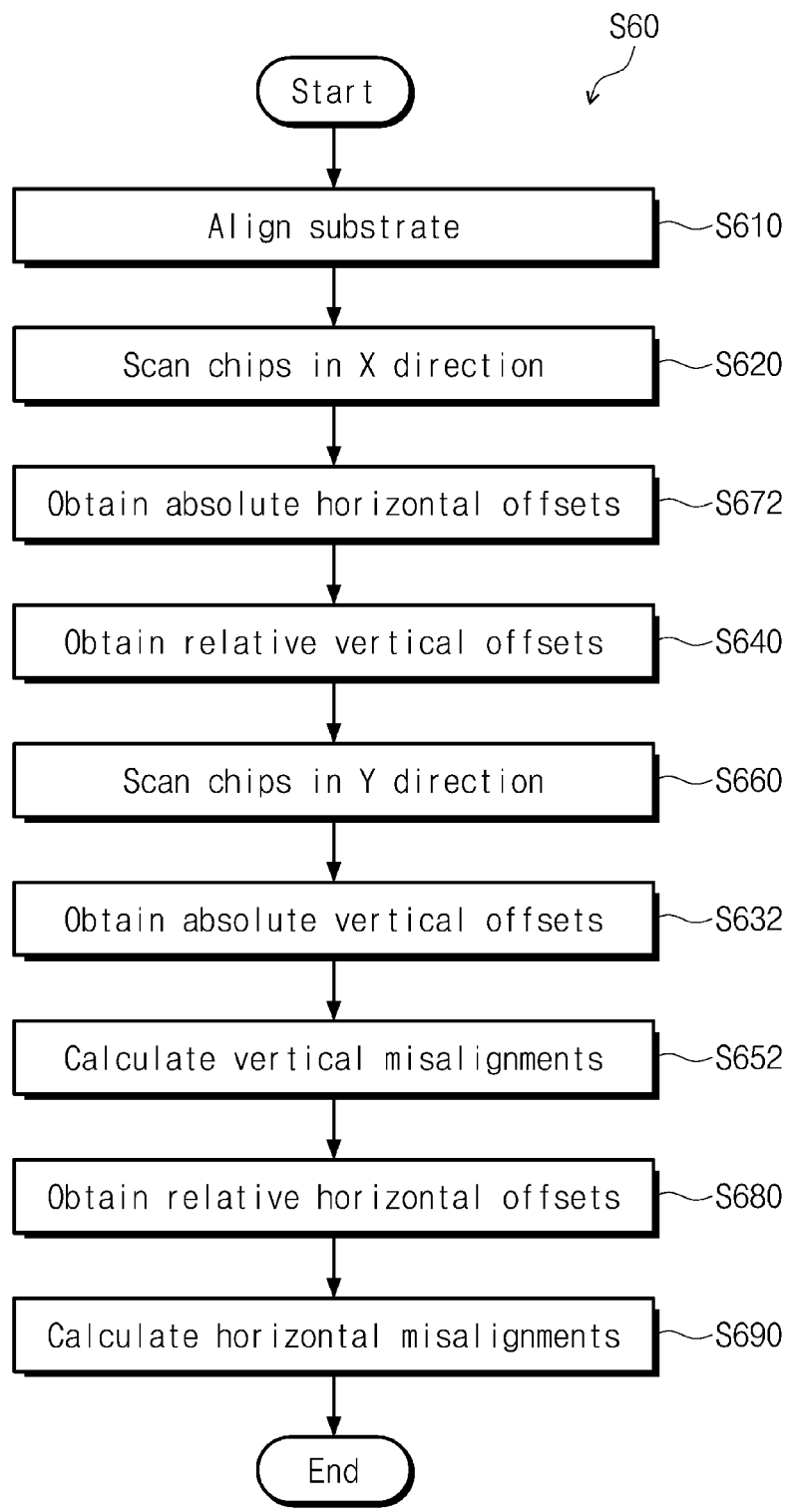
FIG. 35 is a flow chart illustrating an example of the chip misalignment measurement step of FIG. 1.
Figure 36:
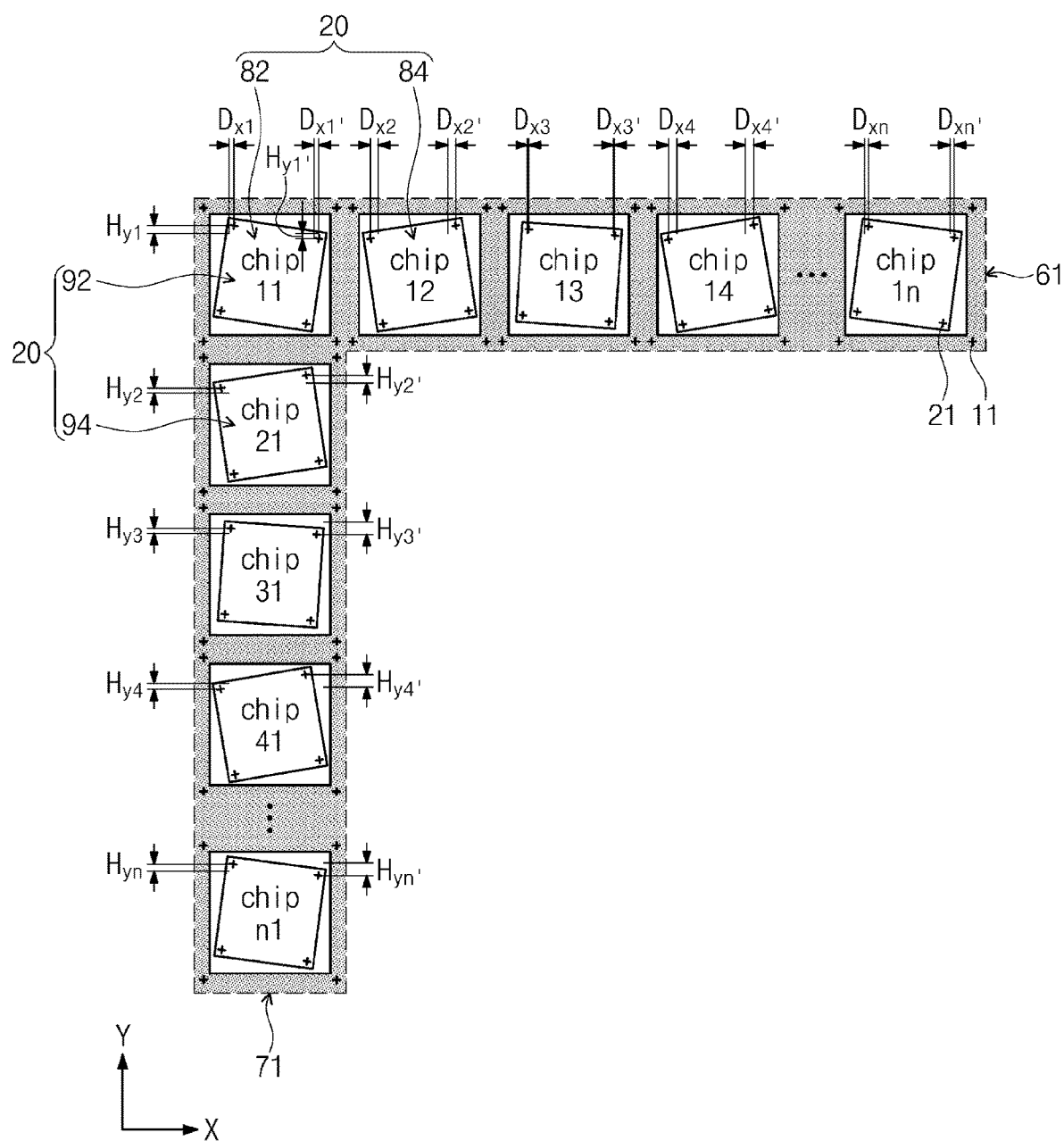
FIG. 36 is a diagram illustrating a first traverse image of FIG. 30 and a first longitudinal image of FIG. 33.

FIG. 35 is a flow chart illustrating an example of the chip misalignment measurement step S60 of FIG. 1. FIG. 36 is a diagram illustrating the first traverse image 61 of FIG. 30 and the first longitudinal image 71 of FIG. 33.

Referring to FIG. 35, the obtaining of the absolute horizontal offsets (in S672) in the chip misalignment measurement step S60 may be performed in advance before the obtaining of the absolute vertical offsets (in S632).

The steps of aligning the substrate 10 (in S610), scanning the chips 20 in the x direction (in S620), obtaining the relative vertical offsets (in S640), scanning the substrate 10 and the chips 20 in the y direction (in S660), and obtaining the relative horizontal offsets (in S680), and calculating the horizontal misalignments Mx of the chips 20 (in S690) may be performed in the same manner as those in FIG. 25.

Referring to FIGS. 30, 33, 35, and 36, the first control unit 56 of FIG. 24 may scan the chips 20 in the x direction (in S620), obtain the left absolute horizontal offsets Dx1-Dxn and the right absolute horizontal offsets Dx1'-Dxn' of the traverse reference chip 82 and the traverse subordinate chips 84 in the first traverse image 61, and obtain the left absolute horizontal offsets Dx1-Dxn and the right absolute horizontal offsets Dx1'-Dxn' of the longitudinal reference chips 92 (in S672). In some example embodiments, the traverse reference chip 82 and the traverse subordinate chips 84 in the first traverse image 61 may correspond to the longitudinal reference chips 92 in the longitudinal images 70. The left absolute horizontal offsets Dx1-Dxn and the right absolute horizontal offsets Dx1'-Dxn' may be obtained by the same method as that of FIG. 33.

Next, the first control unit 56 may obtain relative vertical offsets dy of the traverse subordinate chips 84 in the traverse images 60 (in S640).

Thereafter, the first control unit 56 may scan the chips 20 in the y direction (in S660), obtain left absolute vertical offsets Hy1-Hyn and right absolute vertical offsets Hy1'-Hyn' of the longitudinal reference chip 92 and the longitudinal subordinate chips 94 in the first longitudinal image 71, and obtain left absolute vertical offsets Hy1-Hyn and right absolute vertical offsets Hy1'-Hyn' of the traverse reference chips 82 (in S632). In some example embodiments, the longitudinal reference chip 92 and the longitudinal subordinate chips 94 in the first longitudinal image 71 may correspond to the traverse reference chips 82 in the traverse images 60. The left absolute vertical offsets Hy1-Hyn and the right absolute vertical offsets Hy1'-Hyn' may be obtained by the same method as that of FIG. 30.

The first control unit 56 may calculate vertical misalignments My (in S652). The vertical misalignments My may be obtained faster, compared a method of separately measuring height differences between the substrate 10 and the chips 20.

Next, the first control unit 56 may obtain relative horizontal offsets dx of the longitudinal subordinate chips 94 in the longitudinal images 70 (in S680). The relative horizontal offsets dx may be obtained faster, compared to a method of separately measuring a distance between the substrate 10 and the chips 20.

Thereafter, the first control unit 56 may calculate a horizontal misalignment (in S690). The horizontal misalignment may be obtained faster, compared to a method of separately measuring distances between the substrate 10 and the chips 20.

Referring back to FIGS. 1 and 8, an insulating layer 26 may be formed on the substrate 10, the chip 20, and the encapsulation layer 24 (in S70). The insulating layer 26 may include a photo-imageable dielectric material. For example, the insulating layer 26 may include a photo-imageable dielectric polyimide. The insulating layer 26 may have positive sensitivity.

Referring to FIGS. 1 and 9 to 11, a first contact hole 28 may be formed in the insulating layer 26 (in S80). The first contact hole 28 may be formed by performing a photolithography process on the insulating layer 26.

Figure 9:
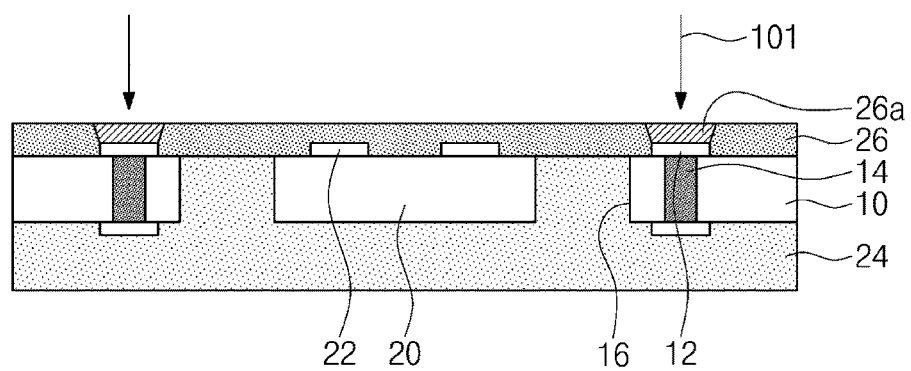
Figure 37:
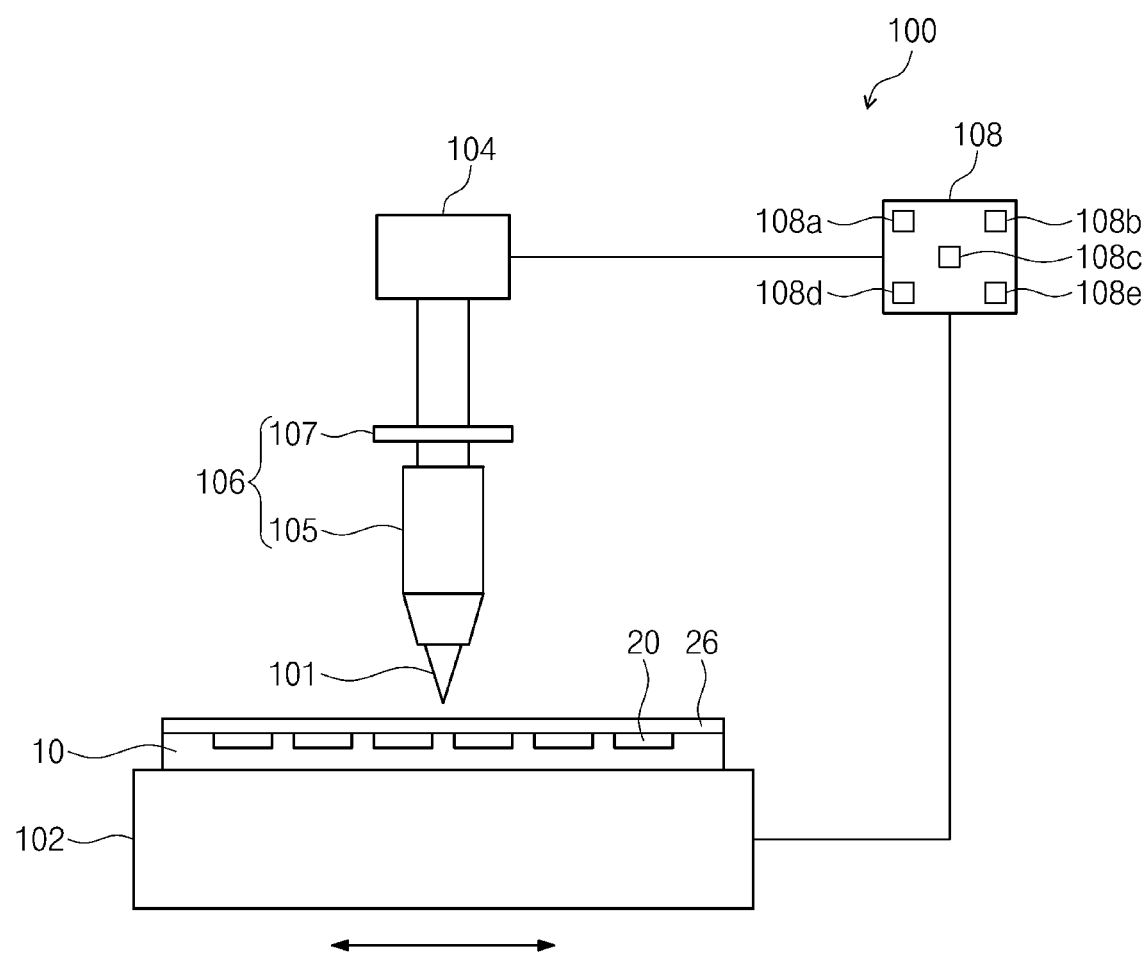
FIG. 37 is a sectional view illustrating an exposure system which is used to provide light to an insulating layer of FIG. 9.

FIG. 37 illustrates an example of an exposure system 100 which may be used to expose the insulating layer 26 of FIG. 9 with light.

Referring to FIGS. 9 and 36, the exposure system 100 may be configured to provide light 101 onto portions of the insulating layer 26 on the substrate pads 12 and the device pads 22.

For example, the exposure system 100 may include a second stage 102, a light source 104, a second optical system 106, and a second control unit 108. The second stage 102 may be configured to allow the substrate 10 to be loaded thereon. The light source 104 may be configured to generate the light 101. The light 101 may have a wavelength of about 436 nm, 365 nm, 248 nm, or 193 nm. The second optical system 106 may be configured to provide a fraction of the light 101 onto the substrate 10. The second optical system 106 may include a second objective lens 105 and a reticle 107. The second objective lens 105 may provide the light 101 onto the substrate 10. The reticle 107 may be provided to have a pattern, allowing the light 101 to have a spatial difference in phase. The light 101 may be projected onto the substrate 10 through the second objective lens 105.

The second control unit 108 may include a processor 108a, a memory 108b, a driving unit 108c, a power supply 108d, and an input/output interface 108e, which may be connected to each other via a bus (not shown). The processor 108a may be a hardware processor such as central processing unit (CPU), a multi-processor, a distributed processing system, an application specific integrated circuit (ASIC), and/or a suitable hardware processing unit. The driving unit 108c may include a motor for adjusting the second stage 102 and a driving circuit for operating the light source 104 and second optical system 106 under the control of the processor 108a. Although not illustrated, the driving unit 108c may include separate components for driving the second stage 102, the light source 104, and the second optical system 106. The memory 108b may be a nonvolatile memory, such as a flash memory, but is not limited thereto. The power supply 108d may include a battery or connect to an external power supply. The input/output interface 108e may be a circuit for transmitting and receiving data and/or commands from a keypad, a keyboard, a touch screen device, a display device, an audio input/output module, and the like.

When executing instructions stored in the memory 108b, the processor 108a may be configured as a special-purpose processor 108a to control the exposure system 100 to form the first portions 26a, second portions 26b, third portions 25a, fourth portions 25b, and fifth portions 25c, and sixth portion 33 described with reference to FIGS. 9-10, 14-15, and 21.

Figure 10:
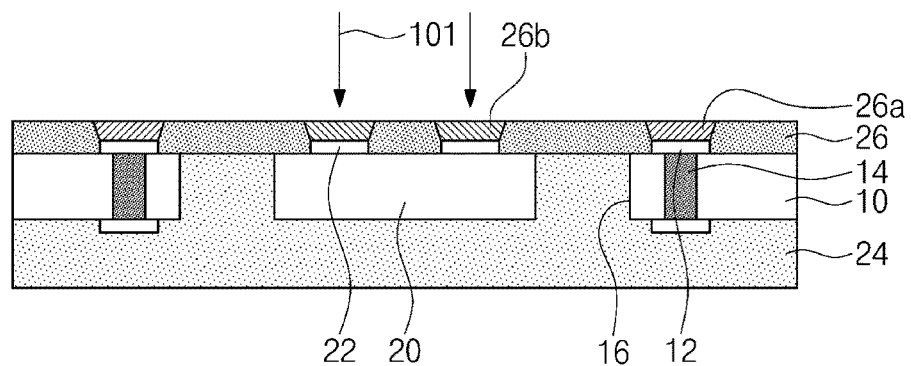
Figure 11:
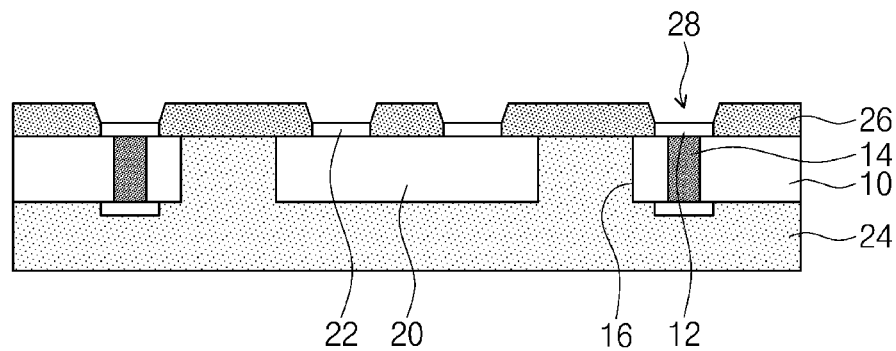
Figure 38:
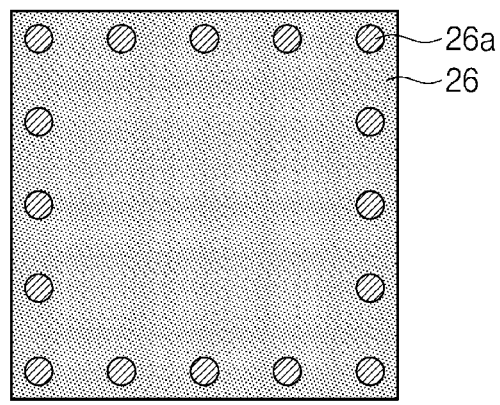
FIGS. 38 to 40 are plan views illustrating insulating layers of FIGS. 9 to 11.
Figure 39:
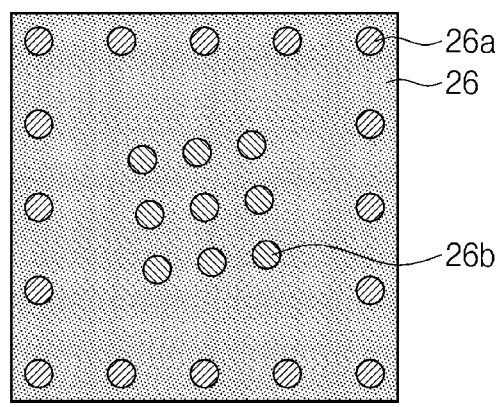
Figure 40:
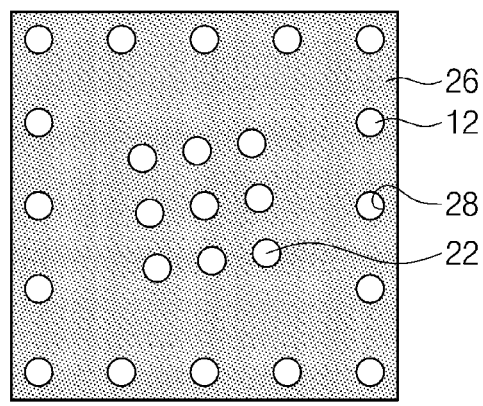

FIGS. 38 to 40 are plan views illustrating the insulating layer 26 of FIGS. 9 to 11, respectively.

Referring to FIGS. 9 to 11 and 38 to 40, the insulating layer 26 may be partially exposed to the light 101.

Referring to FIGS. 9, 27, 37, and 38, in the exposure system 100, the substrate alignment mark 11 may be used to irradiate the light 101 onto the insulating layer 26 on the substrate pad 12 of the substrate 10. The second control unit 108 may be used to align the second optical system 106 to the substrate alignment mark 11. Portions of the insulating layer 26 irradiated by the light 101 may form first portions 26a. In the first portions 26a, binders of the photo-imageable dielectric material may be cut.

Referring to FIGS. 10, 28, 37, and 39, in the exposure system 100, the misalignment M may be used to irradiate the insulating layer 26 on the device pads 22 of the chip 20 with the light 101. The second control unit 108 may be used to align the second optical system 106 to the chip alignment mark 21 at a position corresponding to the misalignment M. Portions of the insulating layer 26 irradiated with the light 101 may form second portions 26b. In the second portions 26b, binders of the photo-imageable dielectric material may be cut. In the case where the insulating layer 26 has a hydrophobic property, the first and second portions 26a and 26b may have a hydrophilic property.

Referring to FIGS. 11 and 40, the first and second portions 26a and 26b of the insulating layer 26 may be removed to expose the substrate pads 12 and the device pads 22. In some example embodiments, the insulating layer 26 may be developed by a developing solution (not shown). The developing solution may contain an alkaline aqueous solution. The first and second portions 26a and 26b may be removed by the developing solution, thereby forming the first contact holes 28. The first portions 26a may be dissolved by a developing solution. The first contact holes 28 may be formed to expose the substrate pads 12 and the device pads 22.

Referring to FIGS. 1 and 12 to 19, the lines 30 may be formed on a portion of the insulating layer 26 and on the substrate pads 12 and the device pads 22 (in S90). The lines 30 may include redistribution lines. In some example embodiments, the lines 30 may be formed by an electroplating method. For example, the lines 30 may include a seed metal layer 29 and a line metal layer 31. The line metal layer 31 may be formed on the seed metal layer 29. When the line metal layer 31 is formed, the seed metal layer 29 may be used as a current-providing layer.

Figure 12:
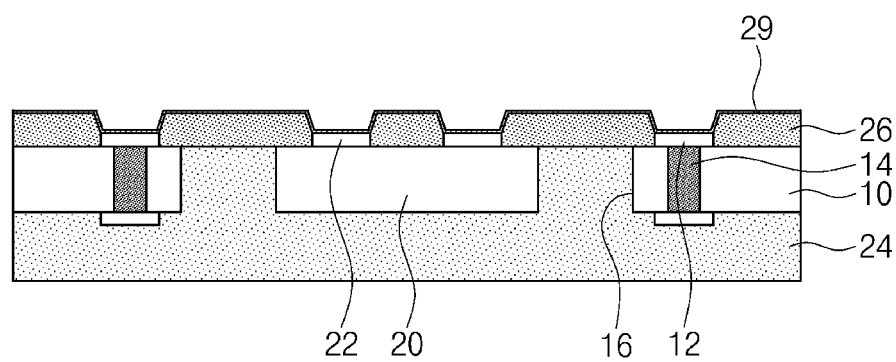

In more detail, as shown in FIG. 12, the seed metal layer 29 may be formed on the substrate pads 12, the device pads 22, and the insulating layer 26. In some example embodiments, the seed metal layer 29 may be formed by a sputtering method or a chemical vapor deposition method. For example, the seed metal layer 29 may be formed of or include tungsten, titanium, tantalum, or aluminum. The seed metal layer 29 may be formed to have a thickness of about 1 nm-100 nm.

Figure 13:
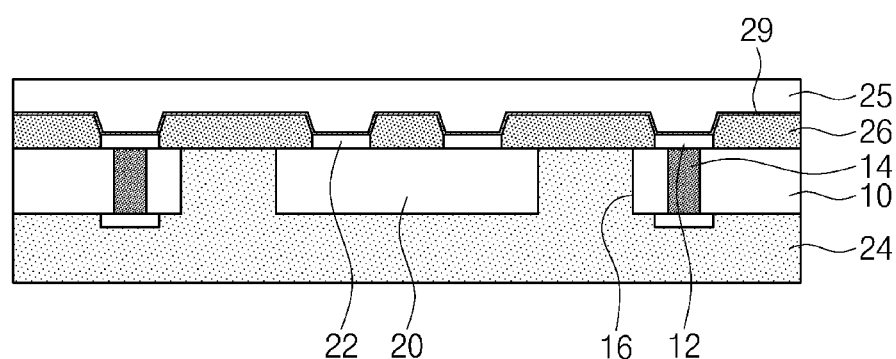

Thereafter, as shown in FIG. 13, a photoresist layer 25 may be formed on the substrate 10. The photoresist layer 25 may be formed by a spin coating method.

Figure 14:
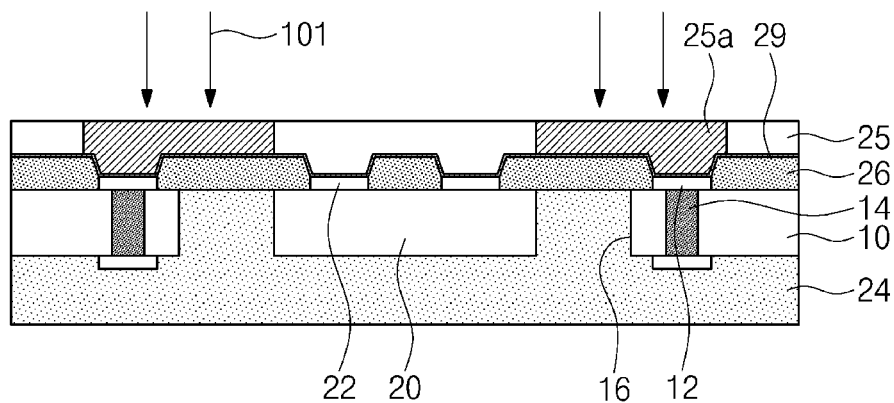
Figure 15:
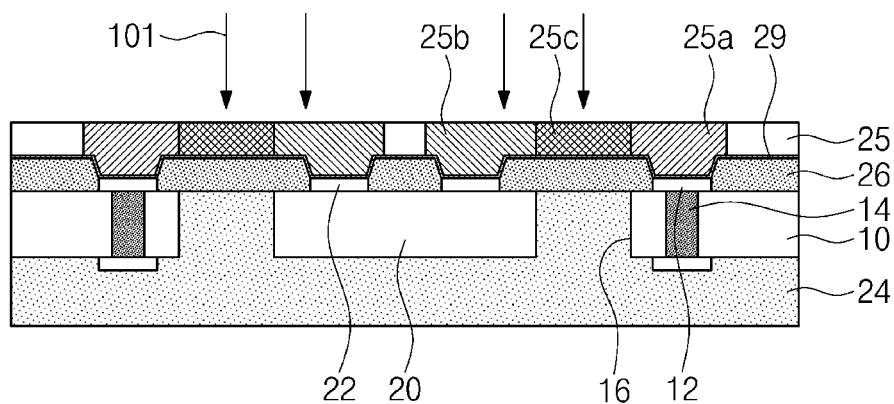
Figure 16:
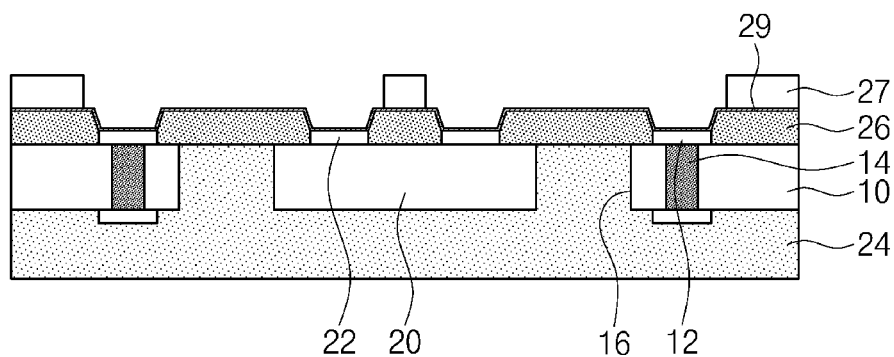
Figure 41:
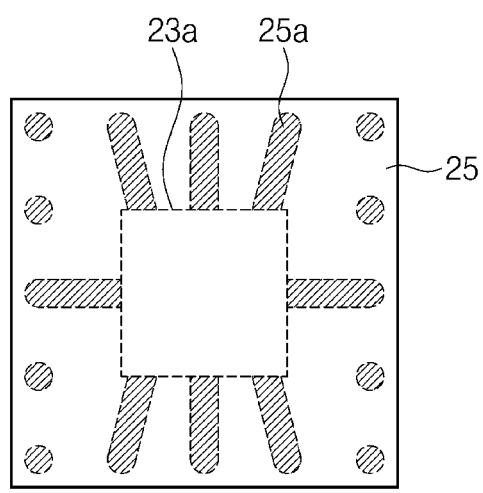
FIGS. 41 to 43 are plan views illustrating photoresist patterns of FIGS. 14 to 16.
Figure 42:
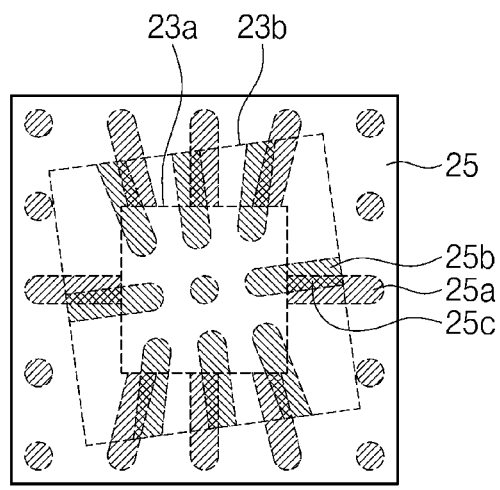
Figure 43:
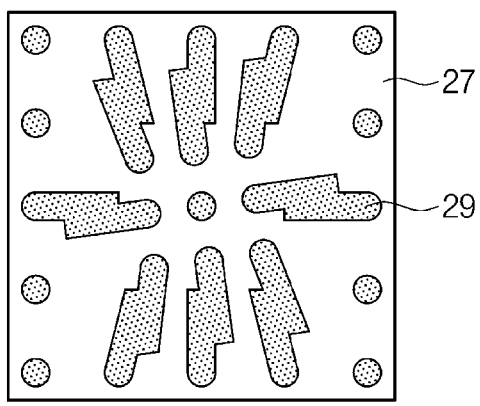

FIGS. 41 to 43 are plan views illustrating the photoresist patterns 27 of FIGS. 14 to 16, respectively.

Referring to FIGS. 14 to 16 and 41 to 43, the photoresist patterns 27 may be formed by performing a double exposure process on the photoresist layer 25.

Referring to FIGS. 14, 27, and 41, the exposure system 100 may be used to provide a first shot 23a to the photoresist layer 25, and here, the first shot 23a may be prepared based on the substrate alignment mark 11 and may include the light 101. The second control unit 108 may be used to align the second optical system 106 to the substrate alignment mark 11. The exposed portion of the photoresist layer 25 may have cut binders. The exposed portion of the photoresist layer 25 may form third portions 25a. The third portions 25a may have a shape extending from the substrate pads 12 to sidewalls of the chip 20 in the cavity 16.

Referring to FIGS. 15, 28, and 42, the exposure system 100 may be used to provide a second shot 23b to the photoresist layer 25, and here, the second shot 23b may be prepared based on the misalignment M and may include the light 101. The second control unit 108 may be used to align the second optical system 106 to the chip alignment mark 21 at a position corresponding to the misalignment M. The exposed portions of the photoresist layer 25 may form fourth portions 25b and fifth portions 25c. Each of the fourth portions 25b may have a shape extending from the device pads 22 of the chip 20 to sidewalls of the substrate 10 in the cavity 16. The fifth portions 25c may be portions, on which the third portions 25a are overlapped with the fourth portions 25b. Each of the fifth portions 25c may have a shape extending from the sidewall of the chip 20 in the cavity 16 to a sidewall of the substrate 10.

Referring to FIGS. 16 and 43, the third to fifth portions 25a-25c may be removed, and thus, a photoresist pattern 27 may be formed from the photoresist layer 25. The removal of the third to fifth portions 25a-25c may be performed using a developing solution.

Figure 17:
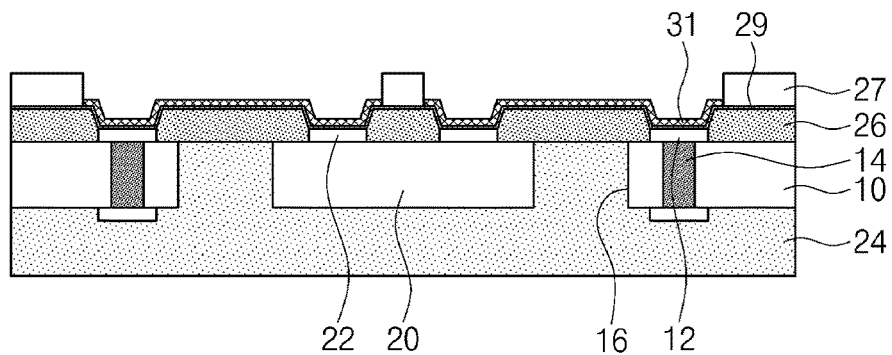

Referring to FIG. 17, the line metal layer 31 may be formed on the seed metal layer 29 that is exposed by the photoresist pattern 27. In some example embodiments, the line metal layer 31 may be formed by an electroplating method. The line metal layer 31 may include, for example, copper.

Figure 18:
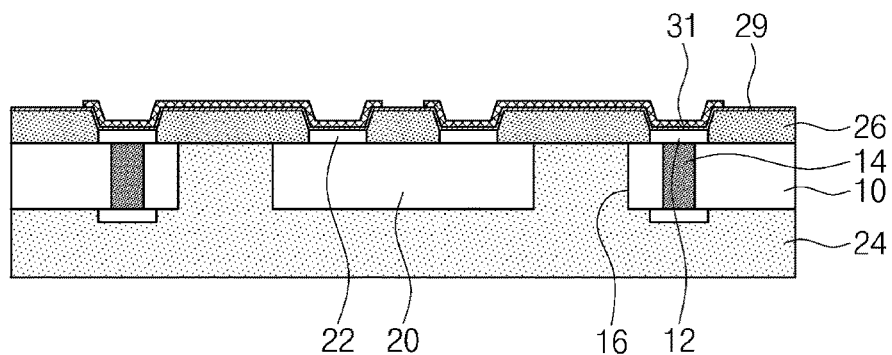

Referring to FIG. 18, the photoresist pattern 27 may be removed. For example, the photoresist pattern 27 may be removed by an organic solvent. In some example embodiments, the line metal layer 31 may be formed by a sputtering method or a chemical vapor deposition method, and in this case, the line metal layer 31 on the photoresist pattern 27 may be removed by a lift-off process.

Figure 19:
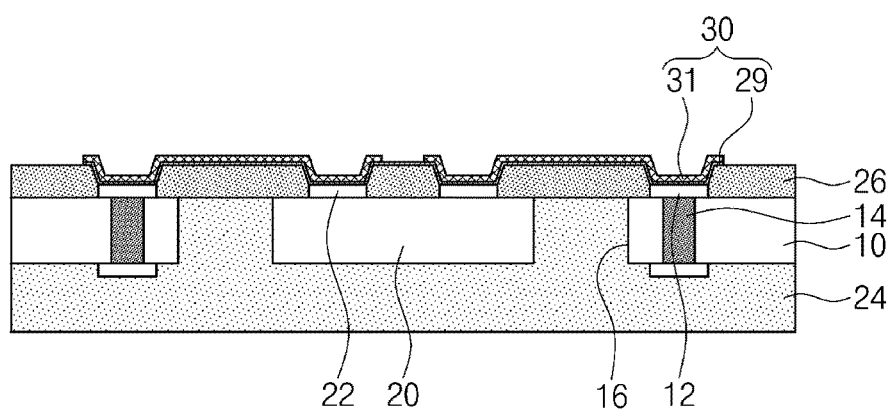
Figure 20:
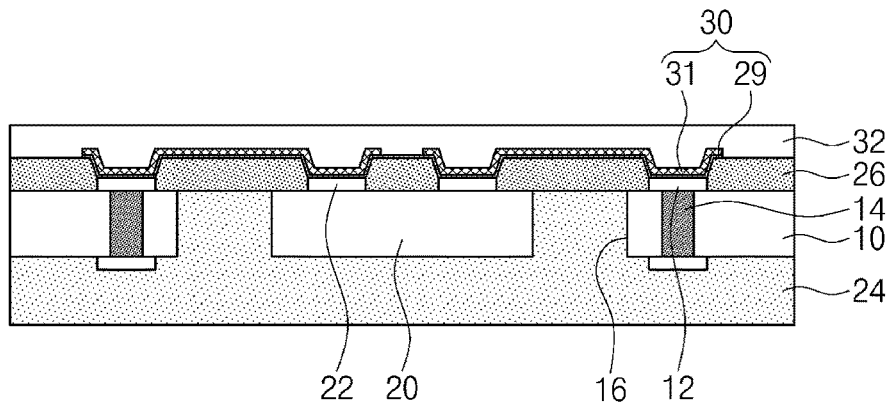

Referring to FIG. 19, a portion of the seed metal layer 29 exposed by the line metal layer 31 may be removed. As a result, the formation of the lines 30 (S90) may be finished. The removal of the seed metal layer 29 may be performed using a wet etching process method. For example, the portion of the seed metal layer 29 may be isotropically etched using an acidic solution containing at least one of hydrochloric acid, sulfuric acid, nitric acid, or acetic acid. In some example embodiments, the removal of the seed metal layer 29 may be performed using a dry etching process method.

Figure 44:
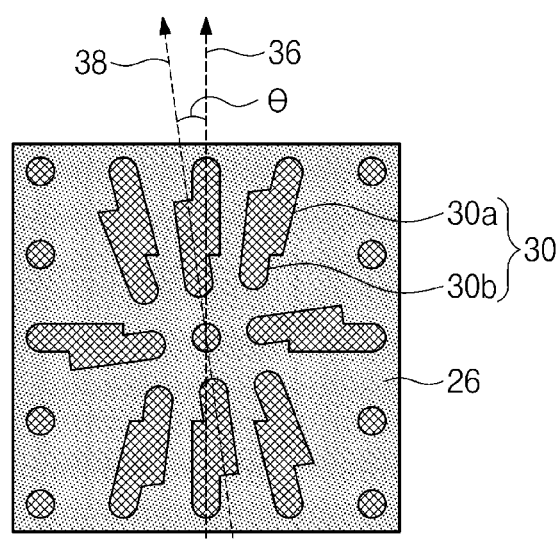
FIG. 44 is a plan view illustrating lines of FIG. 19.

FIG. 44 is a plan view illustrating the lines 30 of FIG. 19.

Referring to FIGS. 19 and 44, the lines 30 may be provided on a portion of the insulating layer 26, the substrate pads 12, and the device pads 22. The lines 30 may be provided to connect the chips 20 to the substrate 10. For example, the lines 30 may connect the substrate pads 12 to the device pads 22. In the case where there is a misalignment of the chip 20, each of the lines 30 may include a first partial line 30a and a second partial line 30b. The first partial line 30a and the second partial line 30b may be connected to each other on the cavity 16 or between the substrate 10 and the chip 20. The first partial line 30a may be formed to extend from the substrate pad 12 of the substrate 10 to a sidewall of the chip 20 in the cavity 16. The second partial line 30b may be formed to extend from the device pad 22 of the chip 20 to a sidewall of the substrate 10 in the cavity 16. In some example embodiments, the first and second partial lines 30a and 30b may have a first extension line 36 and a second extension line 38, respectively. The first and second extension lines 36 and 38 may extend in first and second directions, respectively, which are different from each other. The first and second extension lines 36 and 38 may cross each other on the chip 20. An angle $\theta$ between the first and second extension lines 36 and 38 may be in proportion to the misalignment M.

Referring back to FIGS. 1 and 20, a protection layer 32 may be formed on the lines 30 and a portion of the insulating layer 26 (in S100). The protection layer 32 may be formed of the same material as that of, for example, the insulating layer 26. The protection layer 32 may include a photo-imageable dielectric polyimide.

Figure 21:
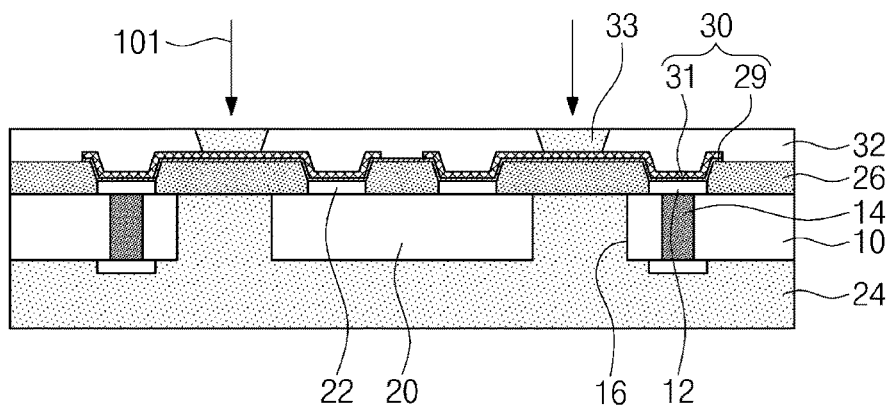
Figure 22:
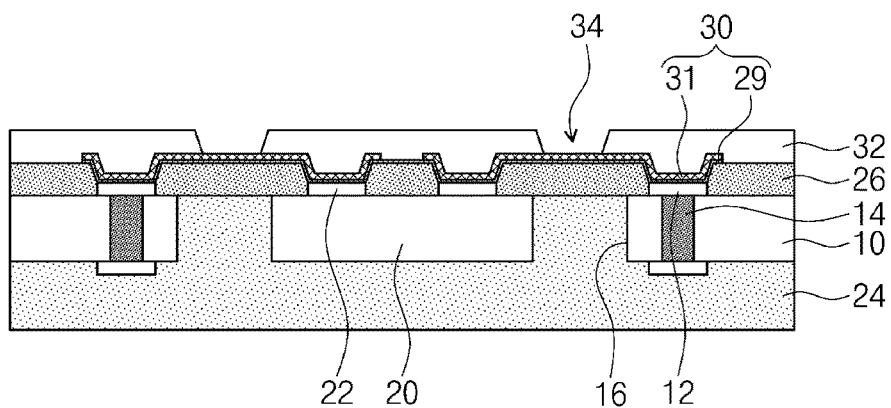

Referring to FIGS. 1, 21, and 22, second contact holes 34 may be formed (in S110). The second contact holes 34 may be formed to partially expose the lines 30.

Referring to FIG. 21, in an exposure system 100, the misalignments M may be used to expose the protection layer 32 with the light 101. As a result of the exposure, sixth portions 33 may be formed in the protection layer 32. The sixth portions 33 may have binders that are cut.

Referring to FIG. 22, the sixth portions 33 of the protection layer 32 may be removed to partially expose the lines 30. The sixth portions 33 may have a hydrophilic property. Developing solution may be used to remove the sixth portions 33, and as a result, the second contact holes 34 may be formed.

Figure 23:
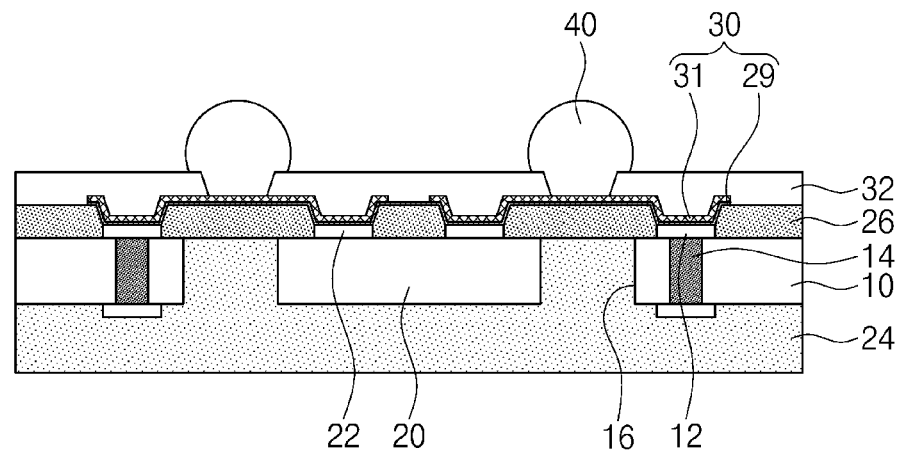

Referring to FIGS. 1 and 23, bumps 40 may be formed in the second contact holes 34 and on the lines 30 (in S120). In some example embodiments, the bumps 40 may be formed between the chip 20 and the substrate 10 or on the encapsulation layer 24. In some example embodiments, the bumps 40 may be formed on the chip 20 or on the substrate 10. The number of the bumps 40 may be in proportion to an area of the substrate 10.

As described above, a misalignment measurement method according to some example embodiments of inventive concepts may include scanning chips in a substrate to obtaining images, obtaining absolute offsets and relative offsets of the chips from the obtained images, and calculating misalignments of the chips from the absolute offsets and the relative offsets. This method may make it possible to more quickly calculate the misalignments, compared to a method of separately measuring misalignments of the chips. The calculated misalignments may be used to improve reliability in an exposure process.

While example embodiments of inventive concepts have been particularly shown and described, it will be understood by one of ordinary skill in the art that variations in form and detail may be made therein without departing from the spirit and scope of the attached claims.

What is claimed is:

1. A method of measuring misalignment of chips in a substrate, comprising:
obtaining images by scanning the substrate and the chips, the chips being arranged in first and second directions in the substrate, the chips including first to n-th chips arranged in the first direction and the second direction, the second direction crossing the first direction;
selecting one of the first and second directions as a selected direction;
setting the k-th chips in the selected direction as reference chips, k being an integer greater than or equal to 1 and less than or equal to n;
setting remaining chips in the selected direction as subordinate chips, the subordinate chips and the reference chips being different from each other among the first to n-th chips arranged in the selected direction;
obtaining absolute offsets of the reference chips with respect to the substrate in the images;

obtaining relative offsets of the subordinate chips with respect to the reference chips in the images; and calculating misalignments of the subordinate chips by summing the absolute offsets and the relative offsets.

2. The method of claim 1, wherein the obtaining images includes scanning the chips in the first direction to obtain traverse images and scanning the chips in the second direction to obtain longitudinal images, the reference chips in the traverse images are traverse reference chips, which are arranged to form a reference column in the second direction, the subordinate chips in the traverse images are traverse subordinate chips, which are arranged to form columns other than the reference column, the reference chips in the longitudinal images are longitudinal reference chips, which are arranged to form a reference row in the first direction, and the subordinate chips in the longitudinal images are longitudinal subordinate chips, which are arranged to form rows other than the reference row.

3. The method of claim 2, wherein the obtaining the absolute offsets includes:

obtaining absolute vertical offsets of the traverse reference chips with respect to the substrate, in the traverse images; and obtaining absolute horizontal offsets of the longitudinal reference chips with respect to the substrate, in the longitudinal images.

4. The method of claim 3, wherein the obtaining the relative offsets includes:

obtaining relative vertical offsets of the traverse subordinate chips with respect to the traverse reference chips, in the traverse images, and obtaining relative horizontal offsets of the longitudinal subordinate chips with respect to the longitudinal reference chips, in the longitudinal images.

5. The method of claim 4, wherein the calculating misalignments of the subordinate chips includes calculating vertical misalignments of the chips in the second direction and calculating horizontal misalignments of the chips in the first direction.

6. The method of claim 5, wherein the calculating the vertical misalignments includes calculating the vertical misalignments based on a sum of the absolute vertical offsets and the relative vertical offsets.

7. The method of claim 5, wherein the calculating the horizontal misalignments includes calculating the horizontal misalignments based on a sum of the absolute horizontal offsets and the relative horizontal offsets.

8. The method of claim 3, wherein the obtaining absolute vertical offsets includes obtaining the absolute vertical offsets based on differences between measured vertical distances of the traverse reference chips with respect to the substrate and reference vertical distances.

9. The method of claim 3, wherein the obtaining absolute horizontal offsets includes obtaining the absolute horizontal offsets based on differences between measured horizontal distances of the longitudinal reference chips with respect to the substrate and reference horizontal distances.

10. The method of claim 2, wherein the reference column of the second direction corresponds to a first one of the longitudinal images, and the reference row of the first direction corresponds to a first one of the traverse images.

11. The method of claim 1, wherein the obtaining absolute offsets of the reference chips further includes calculating the absolute offsets corresponding to first distance differences between first chip alignment marks in the reference chips and first substrate alignment marks in the substrate out of the reference chips, and the obtaining relative offsets of the subordinate chips further includes calculating the relative offsets corresponding to second distance differences between second chip alignment marks in the subordinate chips and second substrate alignment marks in the substrate out of the subordinate chips.

12. A method of fabricating a package, comprising:

forming cavities in a substrate;

applying an adhesive tape to the substrate;

providing chips in the cavity and on the adhesive tape, the chips being arranged in first and second directions in the substrate, the chips including first to n-th chips arranged in the first direction or the second direction;

forming an encapsulation layer on the substrate, the chips, and the adhesive tape;

removing the adhesive tape; and measuring misalignments of the chips with respect to the substrate, the measuring the misalignments of the chips including performing the method of claim 1; and forming an insulating layer on the substrate and the chips.

13. The method of claim 12, further comprising:

forming first contact holes in the insulating layer, wherein the forming the first contact holes includes providing light to a portion of the insulating layer on device pads of the chips, based on the misalignments of the chips.

14. The method of claim 13, wherein the forming the first contact holes further includes providing light to a portion of the insulating layer on substrate pads of the substrate, based on substrate alignment marks of the substrate.

15. The method of claim 14, further comprising:

forming lines on the insulating layer to connect the substrate to the chips, wherein the forming the lines includes forming a seed metal layer on the substrate, forming photoresist patterns on the seed metal layer by performing a photolithography process based on the misalignment of the chips, and forming metal line layers on the seed metal layer between the photoresist patterns.

16. The method of claim 15, wherein the forming of the photoresist patterns includes:

forming a photoresist layer on the insulating layer;

providing light to a portion of the photoresist layer from substrate pads of the substrate to sidewalls of the chips in the cavities, based on the substrate alignment marks; and providing light to a portion of the photoresist layer from device pads of the chips to sidewalls of the substrate in the cavities, based on the misalignments of the chips.

17. The method of claim 1, wherein the chips are spaced apart from each other in rows and columns in the substrate;

the chips include chip alignment marks;

the substrate include substrate alignment marks corresponding to the chip alignment marks;

the obtaining absolute offsets of the reference chips includes obtaining absolute vertical offsets of traverse reference chips with respect to the substrate in the images, the traverse reference chips corresponding to a selected chip from each of the rows of chips, the absolute vertical offsets being based on vertical distance reference values and distances between the chip alignment marks of the traverse reference chips and the substrate alignment marks that are adjacent to the chip alignment marks of the traverse reference chips;

the obtaining relative offsets of the subordinate chips includes obtaining relative vertical offsets of first subordinate reference chips with respect to the traverse reference chips in the images, obtaining absolute horizontal offsets of longitudinal reference chips with respect to the substrate in the images, obtaining relative horizontal offsets of second subordinate reference chips with respect to the longitudinal reference chips in the images, the first subordinate chips corresponding to unselected chips from each of the rows of chips, the relative vertical offsets being based on distances between the chip alignment marks of the traverse reference chips and the chip alignment marks of the first subordinate chips that are adjacent to the chip alignment marks of the traverse reference chips, the longitudinal reference chips corresponding to a selected chip from each of the columns of chips, the absolute horizontal offsets being based on horizontal distance reference values and distances between the chip alignment marks of the longitudinal reference chips and the substrate alignment marks that are adjacent to the chip alignment marks of the longitudinal reference chips, and the second subordinate chips corresponding to unselected chips from each of the columns of chips, the horizontal vertical offsets being based on the absolute horizontal offsets and distances between the chip alignment marks of the longitudinal reference chips and the chip alignment marks of the second subordinate chips that are adjacent to the chip alignment marks of the longitudinal reference chips; and the calculating misalignments of the chips includes calculating misalignments of the chips based on the absolute vertical offsets, the absolute horizontal offsets, the relative vertical offsets, and the relative horizontal offsets.

18. The method of claim 17, wherein
the obtaining absolute vertical offsets is performed before the obtaining absolute horizontal vertical offsets,
the traverse reference chips are all in a selected one of the columns of chips,
the first subordinate reference chips axe from unselected columns of the chips,
the longitudinal reference chips are all in a selected one of the rows of chips, and
the second subordinate reference chips are from unselected rows of the chips.

19. The method of claim 17, wherein
the obtaining relative vertical offsets is performed before the obtaining absolute vertical offsets,
the traverse reference chips are all in a selected one of the columns of chips,
the first subordinate reference chips are from unselected columns of the chips,
the longitudinal reference chips are all in a selected, one of the rows of chips, and
the second subordinate reference chips are from unselected rows of the chips.

20. The method of claim 17, wherein
the obtaining absolute vertical offsets of the traverse reference chips includes determining the absolute vertical offsets based on a difference between the vertical distance reference values and vertical distances between the chip alignment marks of the traverse reference chips and the substrate alignment marks that are adjacent to the chip alignment marks of the traverse reference chips, and
the obtaining absolute horizontal offsets of the longitudinal reference chips includes determining the absolute horizontal offsets based on a difference between the horizontal distance reference values and horizontal distances between the chip alignment marks of the longitudinal reference chips and the substrate alignment marks that are adjacent to the chip alignment marks of the longitudinal reference chips.

* * * * *